(12) United States Patent
Stratz et al.

(10) Patent No.: US 8,164,966 B2
(45) Date of Patent: Apr. 24, 2012

(54) VARIABLE-LOOP-PATH RING OSCILLATOR TEST CIRCUIT AND SYSTEMS AND METHODS UTILIZING SAME

(75) Inventors: Stephen J. Stratz, Shelburne, VT (US); Jerry P. Knickerbocker, Jr., Essex Junction, VT (US); James R. Robinson, Williston, VT (US); Michael J. Slattery, Richmond, VT (US)

(73) Assignee: ASIC North, Williston, VT (US)

( * ) Notice: Subject to any disclaimer, the term of this patent is extended or adjusted under 35 U.S.C. 154(b) by 652 days.

(21) Appl. No.: 12/258,531

(22) Filed: Oct. 27, 2008

(65) Prior Publication Data

US 2010/0102890 A1 Apr. 29, 2010

(51) Int. Cl.
*G11C 7/00* (2006.01)
*G11C 29/00* (2006.01)

(52) U.S. Cl. ... 365/201; 365/191; 365/194; 365/233.11; 365/233.5; 331/44; 331/57

(58) Field of Classification Search .................. 365/201, 365/191, 194, 233.1, 233.11, 233.5; 331/44, 331/57; 716/113, 114, 134
See application file for complete search history.

(56) References Cited

U.S. PATENT DOCUMENTS

| | | | |
|---|---|---|---|
| 5,099,196 A | 3/1992 | Longwell et al. | |
| 5,790,479 A | 8/1998 | Conn | |
| 6,693,434 B2 | 2/2004 | Chetlur et al. | |
| 6,867,613 B1 | 3/2005 | Bienek | |
| 6,944,810 B2 | 9/2005 | Oberle et al. | |
| 7,109,734 B2 | 9/2006 | Yuan et al. | |
| 7,376,001 B2 * | 5/2008 | Joshi et al. | 365/154 |
| 7,414,904 B2 * | 8/2008 | Ehrenreich et al. | 365/201 |
| 7,986,591 B2 * | 7/2011 | Tseng et al. | 368/118 |
| 2010/0095177 A1 * | 4/2010 | Forlenza et al. | 714/731 |

* cited by examiner

*Primary Examiner* — Tuan T Nguyen
*Assistant Examiner* — Lance Reidlinger
(74) *Attorney, Agent, or Firm* — Downs Rachlin Martin PLLC

(57) ABSTRACT

Circuitry for determining timing characteristics, for example, access time, setup time, hold time, recovery time and removal time, of as-manufactured digital circuit elements, such as latches, flip-flops and memory cells. Each element under test is embodied in variable-loop-path ring oscillator circuitry that includes multiple ring-oscillator loop paths, each of which differs from the other(s) in terms of inclusion and exclusion of ones of a data input and a data output of the element under test. Each loop path is caused to oscillate at each of a plurality of frequencies, and data regarding the oscillation frequencies is used to determine one or more timing characteristics of the element under test. The variable-loop-path ring oscillator circuitry can be incorporated into a variety of test systems, including automated testing equipment, and built-in self test structures and can be used in performing model-to-hardware correlation of library cells that include testable as-manufactured digital circuit elements.

32 Claims, 8 Drawing Sheets

(REFERENCE LOOP PATH)

(DATA LOOP PATH)

(DUT LOOP PATH)

VARIABLE-LOOP-PATH RING OSCILLATOR TEST CIRCUIT AND SYSTEMS AND METHODS UTILIZING SAME

FIELD OF THE INVENTION

The present invention generally relates to the field of integrated circuit device characterization. In particular, the present invention is directed to a variable-loop-path ring oscillator test circuit and systems and methods utilizing same.

BACKGROUND

The design of integrated circuits usually requires the assistance of computer aided design tools. The automated development of complex integrated circuits, such as application specific integrated circuits (ASICs), is referred to as electronic design automation (EDA). EDA tools are usually software programs that provide instructions to a computer for processing information associated with a circuit design. Usually, input information for an EDA tool includes characteristics and functional attributes of a circuit in varying levels of abstraction (e.g., from functional operation to physical structure). It is often convenient to group various components of complex circuits into a "block" or "cell" that performs a particular function or operation. The cells are combined with one another to obtain a desired integrated circuit design. These cells are often described and included in a cell library of an EDA tool. For example, a cell in the cell library can represent a sequential element (e.g., a flip-flop, a latch, etc.), a combinational logic element (e.g., an AND gate, OR gate, etc.), and any combination thereof.

Cells that include sequential elements are usually assigned timing values that include, for example, delay, setup, and hold values. The actual delay, setup, and hold values for a particular cell are determined by the inherent characteristics of the elements included in that cell. The sequential cell delay, setup, and hold characteristics of a cell directly affect the proper functioning of a circuit containing one or more instances of that cell. During the circuit-design phase, the characteristics of each cell are encoded into a software model of the cell. These models are utilized in determining a variety of design constraints and making a number of design decisions. Because delay, setup, and hold characteristics of the cells are often crucial to the proper functionality of a device, is very important to include the appropriate timing values in the software models.

Timing values for the software models are typically acquired by simulating the cells using simulation software and then selecting conservative values to account for variations that naturally occur in the process of embodying a design into a physical circuit. However, because timing models are built only on timing parameters that are based on simulations, these timing models do not account for such variation. This can be detrimental to the creation of the physical circuits not only in terms of yield, but also optimal design.

SUMMARY OF THE DISCLOSURE

In one implementation, the present disclosure is directed to a method of obtaining one or more timing characteristic data for an as-manufactured digital storage element having a first input, a second input and an output. The method includes: varying a first delay within a first ring-oscillator path among a plurality of delay values, the first ring-oscillator path including the first input and the output of the as-manufactured digital storage element and having an oscillation state at each of the plurality of delay values; during the varying of the first delay, applying a constant frequency signal of a particular value to the second input; collecting a first data set containing data on the oscillation state of the first ring-oscillator path for each of the plurality of delay values; and generating access time data for the as-manufactured digital storage element as a function of the data in the first data set and the particular value of the constant frequency signal.

In another implementation, the present disclosure is directed to a method of obtaining a timing characteristic design value for an as-manufactured digital storage element. The method includes: determining a set of access time values for the as-manufactured digital storage element based on corresponding respective first test signals having timings differing from one another; determining a set of timing characteristic values for the as-manufactured digital storage element based on corresponding respective second test signals having the timings of the first test signals so that ones of the set of timing characteristic values correspond to respective ones of the set of access time values; and selecting one of the plurality of timing characteristic values to be the timing characteristic design value as a function of the set of access time values.

In still another implementation, the present disclosure is directed to an integrated circuit. The integrated circuit includes: a timing characteristic test circuit that includes: a device under test that has a data input and a data output; a first ring-oscillator path that includes each of the data input and the data output of the device under test, the first ring-oscillator path configured so as to have a range user-selectable delays; a second ring-oscillator path that includes the data input and excludes the data output, the second ring-oscillator path configured so as to have the range of user-selectable delays contained in the first ring-oscillator path; and a third ring-oscillator path that excludes the data input and the data output.

In yet another implementation, the present disclosure is directed to a system for determining timing characteristic data for an as-manufactured device under test. The system includes: an as-manufactured integrated circuit that includes: a timing characteristic test circuit comprising: a device under test having a data input and a data output; a variable-loop-path ring oscillator having an oscillation frequency, the variable-loop-path ring oscillator including: a clock signal generator; a first loop path that includes the clock-signal generator and each of the data input and the data output of the device under test; a second loop path that includes the clock-signal generator and the data input, but excludes the data output; a third loop path that includes the clock signal generator and excludes each of the data input and the data output; multi-delay circuitry for selectably changing the oscillation frequency, the multi-delay circuitry providing a plurality of differing delays to each of the first and second loop paths when that one of the first and second loop paths is operating; and a selector for switching the variable-loop-path ring oscillator among the first, second and third loop paths; and an electrical tap into the variable-loop-path ring oscillator located so as to be present in each of the first, second and third loop paths; and a tester in operative communication with each of the selector and the electrical tap, the tester comprising: a controller for controlling operation of the timing characteristic test circuit, including controlling the selector so as to serially select among the first, second and third loop paths; a data collector for collecting first data relating to the oscillation frequency of the first loop path, for collecting second data relating to the oscillation frequency of the second loop path and for collecting third data relating to the oscillation frequency of the third loop path; and means for calculating timing characteristic values of the device under test as a function of the first, second and third data; wherein the controller is operatively configured to, during collection of each of the first and second data, sequencing the multi-delay circuitry through ones of the plurality of differing delays.

In still yet another implementation, the present disclosure is directed to a computer-readable medium containing computer-executable instructions for performing a method of obtaining a timing characteristic design value from a test circuit. The computer-readable medium includes: a digital storage device under test (DUT) having a data input and a data output; a DUT ring oscillator loop path that includes the data input and the data output and has a first oscillation frequency; a data ring oscillator loop path that includes the data input and excludes the data output and has a second oscillation frequency; and a reference ring oscillator loop path that excludes the data input and the data output and has a third oscillation frequency; wherein the computer-executable instructions comprise: a first set of computer-executable instructions for selecting among the DUT, data and reference ring oscillator loop paths; a second set of computer-executable instructions for, while the DUT ring oscillator loop path is selected, varying the first oscillation frequency among a plurality of frequencies; a third set of computer-executable instructions for collecting first time data from the DUT ring oscillator loop path corresponding to the plurality of frequencies; a fourth set of computer-executable instructions for, while the data ring oscillator loop path is selected, varying the second oscillation frequency among the plurality of frequencies; a fifth set of computer-executable instructions for collecting second time data from the data ring oscillator loop path corresponding to the plurality of frequencies; a sixth set of computer-executable instructions for collecting third time data from the reference ring oscillator loop path corresponding to the plurality of frequencies; an seventh set of computer-executable instructions for determining and storing a plurality of access time values from the first and third time data; and a eighth set of computer-executable instructions for determining and storing a plurality of timing characteristic values from the second and third data.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
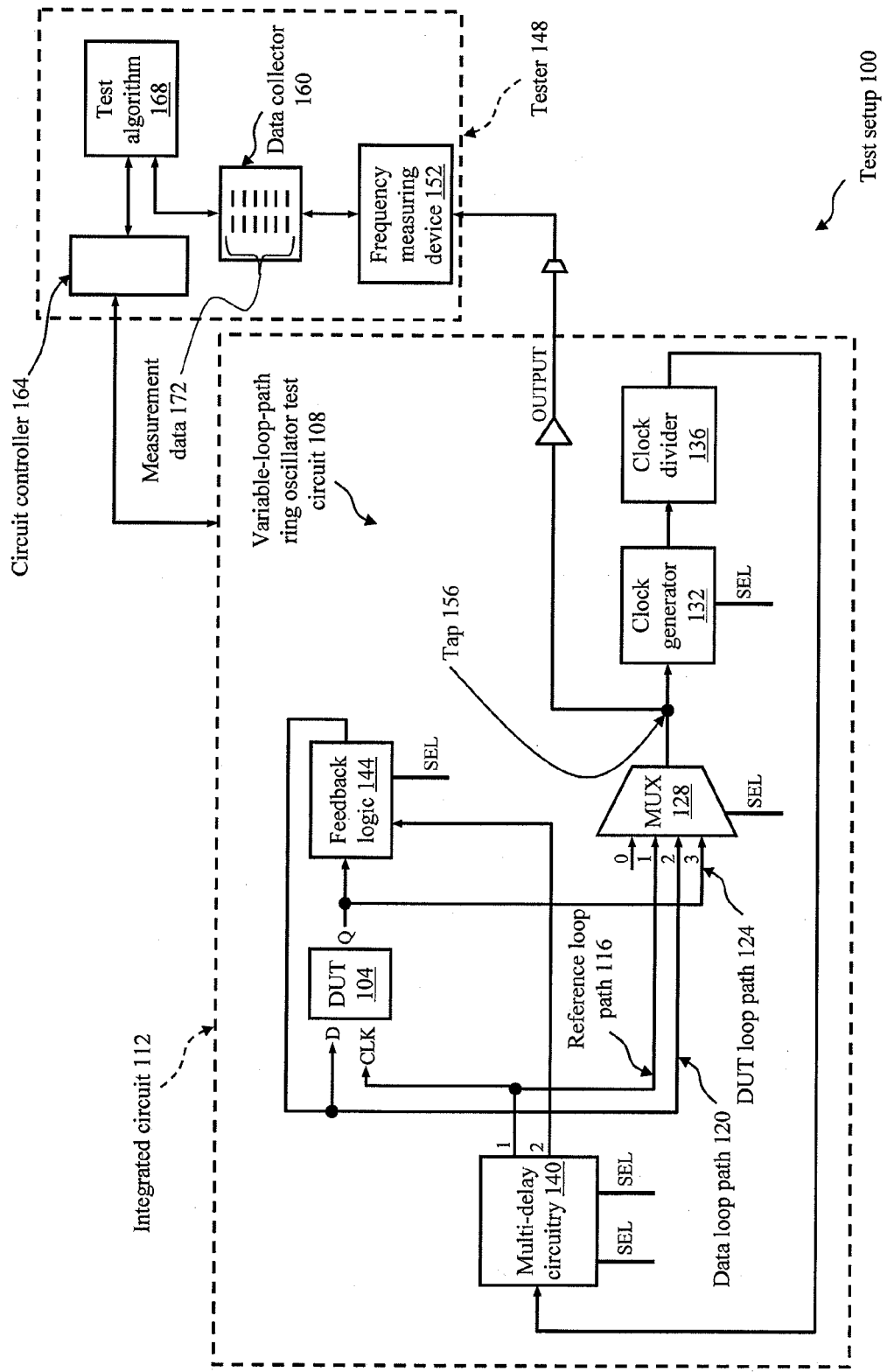
FIG. 1 is a functional block diagram of a test setup of the present disclosure that includes a ring-oscillator test circuit for testing a device under test (DUT)

Referring now to the drawings, FIG. 1 shows a test setup 100 for testing an as-manufactured device under test (DUT) 104 so as to determine one or more timing characteristics of the DUT, such as access time (also known as propagation delay time and propagation gate delay time), setup time, hold time, recovery time, and removal time. As used herein and in the appended claims, the terms "access time," "setup time," "hold time," and others have their commonly understood meanings in the digital circuit arts. For example: "access time" is the time between a digital element receiving an event-gating signal (e.g., a data latch (clock) signal, a data select signal, etc.) and the time the data is available on an output of the element; "setup time" is the interval before the event-gating signal for which the data must be held stable for the element to reliable capture the data; and "hold time" is the interval after the event-gating signal for which the data must be held stable for the element to reliably capture the data.

As those skilled in the art will appreciate from reading this entire disclosure, DUT 104 will typically be any one of various types of sequential (or digital storage) elements, such as a flip-flop, latch, and memory structure (e.g., a static random access memory cell or other addressable structure), among others. For the sake of illustration, FIG. 1 shows DUT 104 as being a flip-flop. Flip-flops are generally non-transparent (e.g., clocked or edge-triggered) devices. Types of flip-flops include, but are not limited to, a D flip-flop (D=data input), a D flip-flop with a reset, a D flip-flop with a set, a D flip-flop with a reset and set, and a JK flip-flop. Latches are generally transparent storage elements. Types of latches include, but are not limited to, a D latch, a D latch with a reset, a D latch with a set, and a D latch with a reset and set. That said, for convenience, FIG. 1 shows DUT 104 as being generalized to include a data (D) input, a clock (CLK) input, and a primary (Q) output.

As described below in detail, test setup 100 can be used, for example, to validate published design library specifications and/or establish more precise timing characteristic parameter values that are based on actual as-manufactured performance of the particular storage element (DUT 104) at issue, rather than values that are based only on a software model of that element. To enable this functionality, test setup 100 includes a variable-loop-path ring oscillator test circuit 108 in operative relationship with DUT 104. As those skilled in the art will appreciate, variable-loop-path ring oscillator circuit 108 and DUT may be integrated together into an integrated circuit 112, which in turn may be executed in a suitable structure, such as a wafer or chip (not shown). As and example, such structure may be a prototype test chip for characterizing hardware cells of a certain design library.

Variable-loop-path ring oscillator test circuit 108 includes three selectable loop paths for stimulating DUT 104 in particular manners and capturing data relating to the timing performance of the DUT that can then be used to calculate one or more timing characteristics of the DUT. As will be discussed below in detail, an important feature of variable-loop-path ring oscillator test circuit made in accordance with broad concepts of this disclosure, such as test circuit 108 of FIG. 1) is the ability of the circuitry to drive differing input lines of a DUT (in FIG. 1, the data (D) and clock (CLK) lines of DUT 104) in a manner that the relative timing of the corresponding signals can be varied in a controllable manner (in FIG. 1, by multi-delay circuitry 140). This ability allows the test circuit to be used to acquire various data that can then be used to calculate timing characteristic values and operation failures for the DUT at differing points of operation and failure. These values can then be used to not only obtain timing failure characteristics, but also suggested timing characteristic design values that provide a margin of safety.

In the embodiment depicted in FIG. 1, the three selectable loop paths of variable-loop-path ring oscillator test circuit 108 are referred to as a reference loop path 116, a data loop path 120 and a DUT loop path 124, each being selectable via a suitable selector, such as multiplexer (MUX) 128. In this example, each of reference, data and DUT loop paths 116, 120, 124 includes elements common to all three loop paths, here, a clock generator 132, a clock divider 136 and multi-delay circuitry 140. It is noted, however, that in alternative embodiments of the three-loop example shown in FIG. 1 that any two or more of the reference, data and DUT loop paths 116, 120, 124 can be implemented as individual loops separate and distinct from one another. Such loops would, of course, require multiple instantiations of the various components of reference, data and DUT loop paths 116, 120, 124 that are common to all three loop paths, such as clock generator 132, clock divider 136 and multi-delay circuitry 140. That said, as those skilled in the art will readily appreciate, a challenge of such an alternative implementation may be the precise matching of the performance of the differing loops.

Briefly, reference loop path 116 excludes both the data input (here, the D input) and data output (here, the Q output) of DUT 104 and is used to obtain oscillation data of variable path ring oscillator test circuit 108 without these components. Data loop path 120 contains the data input of DUT 104 but excludes its data output and is used to obtain oscillation data of variable path ring oscillator test circuit 108 with the data input but without the data output. DUT loop path 124 contains both the data input and data output of DUT 104 and is used to obtain oscillation data of variable path ring oscillator test circuit 108 with these components. As those skilled in the art will understand, each of reference, data and DUT loops paths 116, 120, 124 contains an odd number of signal inversions so as to enable their oscillation.

When DUT loop path 124 is selected, for the DUT loop path to oscillate as a ring oscillator, the data input (here, the D input) of DUT 104 must oscillate at a suitable frequency relative to the frequency of the DUT loop path. To condition the data input of DUT 104 so as to oscillate, variable-loop-path ring oscillator test circuit 108 shown is augmented with feedback logic 144 that provides this oscillation. An example of feedback logic 144 is shown and described below in connection with FIGS. 2 and 5. It is noted that feedback logic 144 is not part of DUT loop path 124, nor reference loop path 116 and data loop path 120. This will be more clearly seen in FIGS. 3 and 4.

Describing example test setup 100 of FIG. 1 in more detail, MUX 128 may be, for example, a conventional 4-to-1 multiplexer that is selected in binary fashion via a set of select (SEL) inputs, using techniques that are well known. For example, inputs 0, 1, 2, and 3 of MUX 118 may be selected via a binary 00, 01, 10, and 11, respectively, using two SEL inputs. In this embodiment: input 0 of MUX 118 is used to open-circuit the ring oscillator portion of variable-loop-path ring oscillator test circuit 108 so as to stop the oscillation of the one of reference, data and DUT loop paths 116, 120, 124 operating at the time; input 1 of the MUX is used to select the reference loop path; input 2 of the MUX is used to select the data loop path and input 3 of the MUX is used to select the DUT loop path, all as described in more detail below.

In this embodiment, MUX 128 has an output electrically connected to an input of clock generator 132, which is a clock generator circuit for generating clock signals having certain timing characteristics. Clock generator 132 has an output electrically connected to an input of clock divider 136, which contains clock divider circuitry for dividing down the clock frequency of the clock generator. Clock divider 136 has an output electrically connected to an input of multi-delay circuitry 140, which may, for example, have a programmable delay having certain predetermined delay range and resolution. In this embodiment, multi-delay circuitry 140 has two independently controlled outputs. The delay of each output of multi-delay circuitry 140 may be selected in binary fashion via respective sets of SEL inputs. Details of examples of multiplexer 128, programmable, clock generator 132, clock divider 136 and multi-delay circuitry 140 are described below in conjunction with FIGS. 2-5.

In this example, multi-delay circuitry 140 has a first output (1) electrically connected to the CLK input of DUT 104 and to input 1 of MUX 128, and further has a second output (2) electrically connected to an input of feedback logic 144. Essentially, output 1 of multi-delay circuitry 140 controls the clock timing of DUT 104 and output 2 of the multi-delay circuitry controls the timing of the data input (here, the D input) of the DUT. The data output (here, Q output) of DUT 104 is electrically connected to input 3 of MUX 128, and feedback logic 144 has an output electrically connected to the data input of DUT 104 and also to input 2 of the MUX. Input 0 of MUX 128 may be tied to a static logic level in order to provide a way to disable ring oscillator test circuit 108, when selected. In one example, input 0 of MUX 128 is tied to a logic "1."

Reference loop path 116 forms a ring oscillator loop that is essentially independent of DUT 104 and that includes MUX 128, clock generator 132, clock divider 136, and multi-delay circuitry 140, which closes the loop back to MUX 118. Data loop path 120 forms a ring oscillator loop that is largely the same as reference loop path 116, but also includes the data input (here, the D input) of DUT 104. As discussed below, in one example of using variable-loop-path ring oscillator test circuit 108 to determine at least one timing characteristic of DUT 104, information regarding the oscillation frequency of data loop path 120 may be used in combination with information regarding the oscillation frequency of reference loop path 116 to determine the setup and hold time of the DUT. DUT loop path 124 includes not only the input of DUT 104, but also the data output (here, the Q output) of the DUT. As further discussed below, in one example of using variable-loop-path ring oscillator test circuit 108 to determine at least one timing characteristic of DUT 104, information regarding the oscillation frequency of DUT loop path 124 may be used in combination with information regarding the oscillation frequency of reference loop path 116 for the purpose of determining the access time (a/k/a "propagation delay time") of the DUT. An exemplary operation of variable-loop-path ring oscillator test circuit 108 may be summarized as follows.

DISABLE mode: Variable-loop-path ring oscillator test circuit 108 is disabled. This is because, when input 0 of MUX 128, which is a static logic level, is selected, there is no feedback path in the circuit to cause the circuit to oscillate. Consequently, there is no oscillating signal in ring oscillator test circuit 100 to be detected (at, for example, the output of MUX 128).

REFERENCE LOOP mode: Only reference loop path 116 is operating. When input 1 of MUX 128 is selected and after providing an initialization pulse, there is a feedback path in the circuit that causes reference loop path 116 to oscillate in a ring-oscillator fashion. The frequency of this ring oscillation may be detected at, for example, the output of MUX 118. The oscillation frequency of reference loop path 116 is determined by the sum of the delay of the active components and wiring of the reference loop path and can be changed by changing the delay value of multi-delay circuitry 140. In particular, the greater the total delay, the lower the frequency of oscillation and the lower the total delay, the higher the frequency of oscillation.

DATA LOOP mode: Only data loop path 120 is operating. When input 2 of MUX 128 is selected and after providing an initialization pulse, there is a feedback path in the circuit that causes data loop path 120 to oscillate in a ring-oscillator fashion. The frequency of this ring oscillation may be detected at, for example, the output of MUX 118. The oscillation frequency of data loop path 120 is determined by the sum of the delay of the active components and wiring of the data loop path and can be changed by changing the delay value of multi-delay circuitry 140. In particular, the greater the total delay, the lower the frequency of oscillation, and the lower the total delay, the higher the frequency of oscillation. The sum of the delay of the active components and wiring of data loop path 120 is expected to be slightly greater than that of reference loop path 116.

DUT LOOP mode: Only DUT loop path 124 is operating. When input 3 of MUX 128 is selected and after providing an initialization pulse, there is a feedback path in the circuit that causes DUT loop path 124 to oscillate in a ring-oscillator fashion. The frequency of this ring oscillation may be detected at, for example, the output of MUX 128. The oscillation frequency of DUT loop path 124 is determined by the sum of the delay of the active components and wiring of the DUT loop path and can be changed by changing the delay value of multi-delay circuitry 140. In particular, the greater the total delay, the lower the frequency of oscillation, and the lower the total delay, the higher the frequency of oscillation. The sum of the delay of the active components and wiring of DUT loop path 124 is expected to be slightly greater than that of reference loop path 116.

Test setup 100 also includes a tester 148 for operating variable-loop-path ring oscillator test circuit 100 and for performing the measurements and calculations that are required for analyzing the performance of certain devices, each represented in FIG. 1 by DUT 104. Depending on the embodiment, tester 148 may be incorporated into one or more devices that are separate from integrated circuit 112 or it may be integrated onto the same structure (e.g., chip or wafer) that contains integrated circuit 112. As examples of the former, tester 148 can be implemented using a computer (not shown) (e.g., a personal computer), one or more pieces of test equipment (e.g., an oscilloscope), a piece of automated testing equipment, and any combination thereof. In an example of the latter, tester 148 can be implemented in a built-in self-test macro integrated into the same structure (e.g., chip or wafer) that contains integrated circuit 112. Those skilled in the art are readily familiar with how to implement both schemes and combinations thereof such that further explanation is not necessary for those skilled in the art to execute this aspect of the present disclosure.

In this example, tester 148 includes a frequency measuring device 152 for measuring the frequency of oscillation of the ring oscillator portion of variable-loop-path ring oscillator circuit 108 (i.e., of each of reference, data and DUT loop paths 116, 120, 124 when each is active). Frequency measuring device 152 may be any suitable frequency measuring device, such as any commercially available oscilloscope or frequency counter, which is capable of operating within the expected operating frequency range of ring oscillator test circuit 100. When frequency measuring device 152 is located off-board of the structure (not shown) that contains integrated circuit 112, it may be electrically connected to a tap 156 into the ring oscillator portion of variable-loop-path ring oscillator test circuit 108 via an input/output (I/O) pin (not shown) on the device. For example, an input of frequency measuring device 152 may be connected to an OUTPUT I/O pin of integrated circuit 112.

Tester 148 also includes a data collector 160, a circuit controller 164 and a test algorithm 168. Data collector 160 collects measurement data 172 from frequency measuring device 152. As those skilled in the art will appreciate, data collector 160 may be implemented using any suitable element or combination of elements, including a digital information storage device (not shown) (e.g., solid state memory, hard drive, and any other type of memory and combinations thereof), software and interface(s) necessary to communicate with frequency measuring device 152. Circuit controller 164 controls the operation of variable-loop-path ring oscillator test circuit 108 in response to, for example, instructions provided by test algorithm 168. As those skilled in the art will understand, circuit controller 164 may be executed using any suitable hardware, software or combination thereof.

Test algorithm 168 utilizes measurement data 172 collected during a test session in calculating one or more timing characteristics of DUT 104. As mentioned above, test algorithm 168 may also be used to provide directions to circuit controller 164, as well as data collector 160 and frequency measuring device 152, if needed. As those skilled in the art will understand, test algorithm 168 may be executed in software, hardware or combination thereof as desired to suit a particular implementation. By operating each of reference loop path 116, data loop path 120 and DUT loop path 124 using the differing delays of multi-delay circuitry 140, and by measuring the frequency of each loop for each delay, certain calculations can be performed for determining, for example, but not limited to, access time, setup time, hold time, recovery time, removal time and pulse width of the certain cell types that are represented by DUT 112. These hardware performance characteristics may then be used, for example, to perform model-to-hardware correlation for a certain design library. In this way, variable-loop-path ring oscillator test circuit 108 provides a mechanism of validating the published design library specifications. As a particular example, timing-characteristic calculations that can be performed by test algorithm 168 utilizing reference, data and DUT loop paths 116, 120, 124 shown are as follows:

Access time=[(period of DUT loop path)−(period of reference loop path)];

Setup time=[(period of reference loop path)−(period of data loop path)]; and

Hold time=[(period of data loop path)−(period of reference loop path)].

Figure 8:
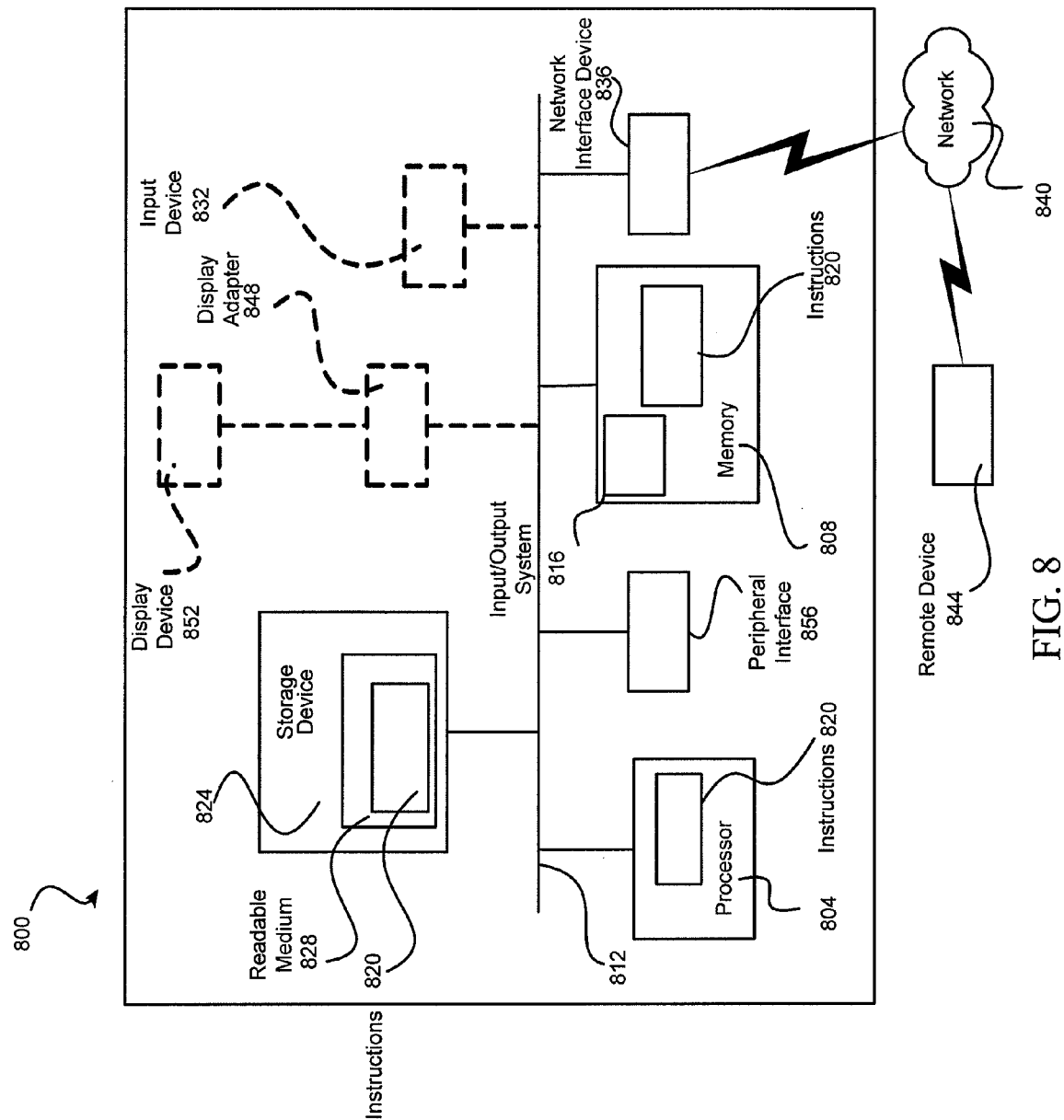
FIG. 8 is a high-level schematic diagram of a computer system that can be used to implement a testing method containing steps in accordance with the present disclosure.

Tester 148 may further include one or more data stores (not shown) for storing various data other than/in addition to measurement data 172, such as the data used by and/or generated by test algorithm 168. Data that may be stored in such data store(s) may include, but is not limited to: a loop type for each measurement; a programmable delay value for each measurement; a timestamp for each measurement; a DUT identifier for each measurement; a chip identifier for each measurement and a calculated access time, setup time, hold time, recovery time, removal time, and/or pulse width value, as appropriate, for each measurement. Details of specific examples of implementing and using a variable-loop-path ring oscillator test circuit of the present disclosure, such as variable-loop-path ring oscillator test circuit 108, are described below in connection with FIGS. 2-6. FIG. 8 illustrates a general purpose computer system 800 that can be used to implement, via software, a test method containing steps in accordance with the present disclosure. For example, computer system 700 may be configured and/or programmed to control the operation of variable-loop-path ring oscillator test circuit 108 to partially or fully automate the testing of DUT 104. In addition, or alternatively, computer system 700 may be configured and/or programmed to automatedly manipulate the data acquired via testing of DUT 104 so as to produce desired output, such as graphs and tables of the data, timing characteristics' failure points, and suggested timing characteristic design values, among other things.

It is noted that while FIG. 1 shows integrated circuit 112 that includes one variable-loop-path ring oscillator test circuit 108 for testing a single DUT 104, an integrated circuit made in accordance with concepts of the present disclosure is not so limited. Rather, any number of variable-loop-path ring oscillator test circuits and respective DUTs, for example, of differing types, may be implemented in the integrated circuit device so as to permit the determination of one or more timing characteristics of multiple types of library cells using a single integrated circuit device. More particularly, those skilled in the art will appreciate that the broad concepts embodied in the examples presented in the accompanying figures may be adapted for use with other testing situations. For example, virtually any sequential digital element can be tested using a variable-delay methodology in which the timing between two or more driving signals input into the element is controllably varied to stimulate the element in a manner that produces desired responses in the ring-oscillator loop paths. While in some embodiments the driving signals will correspond to data and clock inputs as in the illustrative example of FIGS. 1-7, in other embodiments the driven inputs may be different. For example, in a mux flip-flop having two or more data inputs and a select input, the broad variable-loop-path, variable-timing techniques may be applied to the data inputs each in combination with the select input. In one such example having two data inputs, a suitable variable-loop-path ring oscillator test circuit can be similar to test circuit 108 of FIG. 1, but further include balanced muxing on the data and DUT loop paths to separately test each of the two data inputs in combination with the select input. In another example, the same broad variable-loop-path, variable-timing techniques can be applied to memory via the data-input and address lines. Only a single variable-loop-path ring oscillator circuit is shown in FIG. 1, and also in FIGS. 2-5, to simplify the explanation of broad concepts of the present disclosure.

Figure 2:
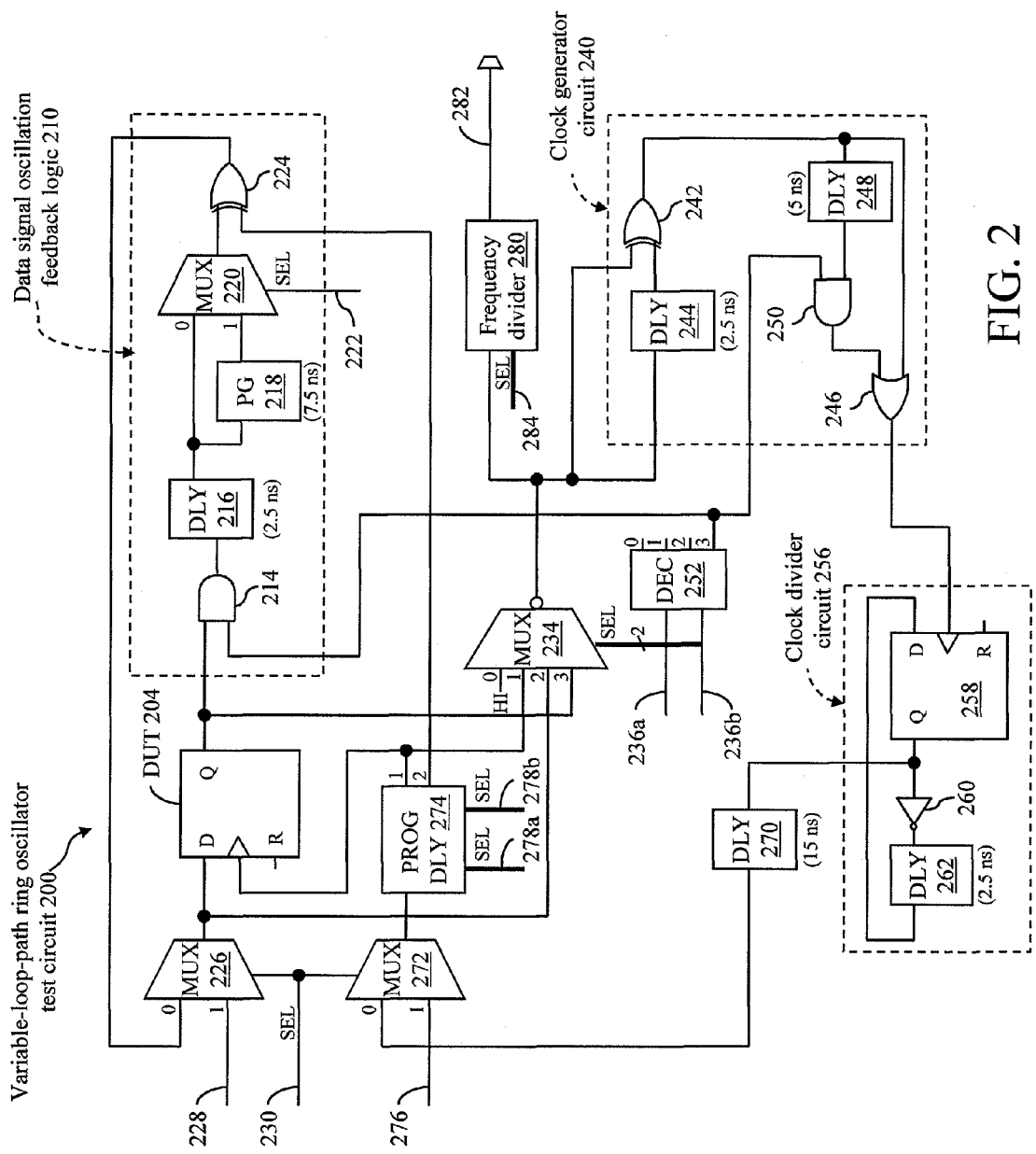
FIG. 2 is a schematic diagram of a variable-loop-path ring oscillator test circuit suitable for use as the variable-loop-path ring oscillator test circuit of FIG. 1.

FIG. 2 illustrates a variable-loop-path ring oscillator test circuit 200 that may be used for variable-loop-path ring oscillator test circuit 108 of FIG. 1. Variable-loop-path ring oscillator test circuit 200 includes a DUT 204, which corresponds to DUT 104 of FIG. 1. However, by way of example, FIG. 2 illustrates DUT 204 as being a D flip-flop having a clock input, a D-input and a Q-output. Ring oscillator test circuit 200 is, therefore, an example of a ring oscillator test circuit 100 of FIG. 1 for determining the setup time, hold time, and access time of a D flip-flop cell, which may belong to a certain design library. In doing so, the test results may be used to validate whether the published specifications of the software model of the D flip-flop cell substantially correlate with the performance characteristics of the actual hardware implementation of the D flip-flop cell, here DUT 204.

The Q-output of DUT 204 is electrically connected to data signal oscillation feedback logic 210 that corresponds to data signal oscillation feedback logic 144 of FIG. 1. In this example, feedback logic 210 contains an AND gate 214, a delay (DLY) 216 (about a 2.5 nanosecond (ns) delay in this example), a pulse generator (PG) 218 (about a 7.5 ns pulse generator in this example), a 2-to-1 MUX 220 that is controlled via a select signal (SEL) 222, and an XOR gate 224, all of which are electrically connected as shown in FIG. 2. MUX 220 provides a selection of (1) the Q-output of DUT 204 delayed via delay 216 and of a non-specified pulse width and (2) the Q-output of DUT 204 delayed via delay 216 and of a specified pulse width per pulse generator 218. The output of MUX 220 feeds an input of XOR 224. The output of XOR gate 224 is fed back to the D-input of DUT 204 via a 2-to-1 MUX 226. MUX 226 has another input 228, which is used for preconditioning DUT 204. MUX 226 is controlled via a select signal 230.

Variable-loop-path ring oscillator test circuit 200 also includes a MUX 234, which is substantially the same as MUX 128 of FIG. 1. MUX 234 may be, for example, a conventional 4-to-1 multiplexer that is selected in binary fashion via select inputs (SEL) 236a and 236b, as is well known. For example, inputs 0, 1, 2 and 3 of MUX 234 may be selected via a binary 00, 01, 10 and 11, respectively, on select inputs 236a and 236b. Like MUX 128 of FIG. 1, MUX 234 is used to select the operating mode of ring oscillator test circuit 200, e.g., DISABLE mode, REFERENCE LOOP mode, DATA LOOP mode and DUT LOOP mode, which may be as described above relative to FIG. 1. Additionally, the output of MUX 234 provides a signal inversion and is electrically connected to a clock generator circuit 240. Clock generator circuit 240 is one example instantiation of clock generator 132 of FIG. 1.

In the example of FIG. 2, clock generator circuit 240 includes an exclusive OR (XOR) gate 242, a delay 244, an OR gate 246, a delay 248 and an AND gate 250 that are electrically connected as shown in FIG. 2. The combination of XOR gate 242 and delay 244 provide a pulse generator function for the output of MUX 234. More specifically, the arrangement of XOR gate 242 and delay 244 converts any rising or falling transition at the output of MUX 234 to a pulse that has a pulse width that is substantially the same as the delay value of delay 244. In the present example, when delay 244 is about a 2.5 ns delay, any rising or falling transition at the output of MUX 234 is converted to about a 2.5 ns pulse at the output of XOR gate 242.

The output of XOR gate 242 feeds the arrangement of OR gate 246, delay 248 and AND gate 250, which provides a pulse singling or pulse doubling function. AND gate 250 is used to select the pulse singling or pulse doubling function. More specifically, when a 1-of-4 decoder (DEC) 252 detects a binary 00, 01, or 10 at SELs 236a and 236b of MUX 234, AND gate 250 is disabled and the output of XOR 242, which is connected to one input of OR 246 passes through OR gate 246 as a single 2.5 ns pulse. However, when decoder 252 detects a binary 11 at SEL 236a and 236b of MUX 234, AND gate 250 is enabled and the output of XOR gate 242 that is delayed by delay 248 is provided at another input of OR gate 246, thereby providing a pulse doubling at the output of OR gate 246. In the present example, when delay 248 is about a 5 ns delay, the output of OR gate 246 may be about a first 2.5 ns pulse followed about 5 ns later by a second 2.5 ns pulse.

In summary, when select inputs 236a and 236b of MUX 234 are a binary 00, 01, or 10, the output of clock generator circuit 240 may be a single 2.5 ns pulse for every rising or falling transition of the output of MUX 234. Alternatively, when select inputs 236a and 236b of MUX 234 are a binary 11, the output of clock generator circuit 240 may be a double 2.5 ns pulse for every rising or falling transition of the output of MUX 234. In other words, and referring to FIGS. 2 and 1, clock generator circuit 240 provides a single pulse when the REFERENCE LOOP mode (corresponding to reference loop path 116 of FIG. 1) or DATA LOOP mode (corresponding to data loop path 120 of FIG. 1) is selected, and clock generator circuit 240 provides a double pulse when the DUT LOOP mode (corresponding to DUT loop path 124 of FIG. 1) is selected.

The output of clock generator circuit 240 is electrically connected to an input of a clock divider circuit 256. Clock divider circuit 256 is one example instantiation of clock divider 136 of FIG. 1. Clock divider circuit 256 divides down the clock frequency of clock generator circuit 240. In one example, clock divider circuit 256 may be any well-known divide-by-2 clock divider circuit, such as one that includes a D flip-flop 258, an inverter 260 and a delay 262 (here, about a 2.5 ns delay) that are electrically connected as shown in FIG. 2. In this example, clock divider circuit 256 is used to divide-by-2 the output frequency of clock generator circuit 240.

An output of clock divider circuit 256 passes through a delay 270 (here, about a 15 ns delay) and through a 2-to-1 MUX 272 before connecting to an input of a programmable delay (PROG DLY) 274, which corresponds to multi-delay circuitry 140 of FIG. 1. MUX 272 has another input 276, which is used for preconditioning DUT 204. SEL 230 is common to MUX 226 and MUX 272. Programmable delay 274 has a certain predetermined delay range and resolution. In this example, programmable delay 274 has two independently controlled outputs. The delay of each output of programmable delay 274 may be selected in binary fashion via a corresponding first and second set 278a, 278b of select signals. In this example, output 1 of programmable delay 274 is electrically connected to the clock input of DUT 204 and to input 1 of MUX 234. Output 2 of programmable delay 274 is electrically connected to an input of XOR gate 224 of feedback logic 210. Essentially, output 1 of programmable delay 274 controls the clock timing of DUT 204, and output 2 of programmable delay 274 controls the timing of the D-input of DUT 204. Therefore, the timing relationship between outputs 1 and 2 of programmable delay 274 dictates the timing relationship between the clock and D-input of DUT 204.

The full delay range of programmable delay 274 may be dependent on the particular technology in which DUT 204 is implemented. Similarly, the resolution of programmable delay 274 may be technology dependent and may also be dependent on the measurement accuracy specified by a designer. In one example, the full delay range of programmable delay 274 may be about 10 to about 20 propagation gate delays of a given technology, and the resolution may be about one quarter to about one half of a propagation gate delay of the given technology. In another example and referring to FIG. 2, the full delay range of programmable delay 274 may be about 10 to about 20 clock-to-Q-output propagation gate delays of D flip-flop 204 in a given technology, and the resolution may be about one quarter to about one half of the clock-to-Q-output propagation gate delay of the D flip-flop of the given technology. In these examples, for a given fixed DUT clock timing (provided by output 1 of programmable delay 274), the DUT data timing (provided by output 2 of programmable delay 274) may be skewed, for example, about 5 to about 10 propagation gate delays on either side of the clock. In a specific example implemented in 180 nm technology, the full delay range of programmable delay 274 may be about 100 picoseconds (ps) to about 500 ps, with a resolution of about 5 ps to about 10 ps. It is noted that for any given test the full range of programmable delay 274 need not necessarily be used.

Regarding the various fixed delays 216, 218, 244, 248, 262, 270 described above, general guidelines for establishing delay values for these delays are as follows. The delay value of delay 216 should be greater than the hold time specification for DUT 204. Delay 218 is employed when DUT 204 is a latch. The delay value of delay 218 should be the sum of delay 244 and delay 248. This serves to delay the transition of the data (D) pin of DUT 204 until after the fall of the clock at the clock pin of the DUT. The delay value of delay 244 should be long enough to ensure that the minimum pulse width at the output of XOR gate 242 is greater than the minimum active pulse width specified for flip flop 258. The delay value of delay 248 should be greater that the sum of the minimum active pulse width and the minimum inactive pulse width specified for the flip-flop 258. The delay value of delay 262 should be greater than the hold time specification for-flip flop 258. The delay value of delay 270 should be large enough to ensure that only one pulse is circulating in the ring oscillator. In one example, making the delay value of delay 270 equal to three times the delay value of delay 248 has yielded good results.

With continuing reference to FIG. 2, the output of MUX 234 feeds an input of a frequency divider 280, which drives an I/O pin 282 that may be monitored by, for example, frequency measuring device 142 of FIG. 1. Frequency divider 280 may be a programmable frequency divider circuit that provides a divide-by-1 (÷1) to a divide-by-n (÷n) capability. In one example, frequency divider 280 provides ÷1, ÷2, ÷4, ÷8, ÷16, ÷32, ÷64 and ÷128 capability that is selectable via a set of select signals 284. The purpose of frequency divider 280 in ring oscillator test circuit 200 can include (1) slowing down the output signal of variable-loop-path ring oscillator test circuit 200 in order to match the capabilities of external measurement equipment, such as frequency measuring device 152 (FIG. 1), and/or (2) dividing down any jitter that may be present on the output signal of the variable-loop-path ring oscillator test circuit in order to ensure the accuracy of the frequency measurements by reducing variations in the measurements and subsequent calculations (i.e., in order to minimize the standard deviation).

The various select inputs and signals 222, 230, 236a-b, 278a-b, 284 described above may be connected to, for example, certain register bits (not shown) within circuit controller 164 of tester 148 of FIG. 1. Furthermore, the state of the various select inputs and signals 222, 230, 236a-b, 278a-b, 284 may be controlled, for example, circuit controller 164, test algorithm 168 of FIG. 1 or combination thereof. It is also noted that in alternative embodiments, the placement and delay values of the various fixed delay devices (e.g., delay 216, delay 244, delay 248, delay 262, and delay 270) are not limited to that which is shown in variable-loop-path ring oscillator test circuit 200 of FIG. 2, and the timing of the variable-loop-path ring oscillator test circuit 200 may be tailored in any fashion for differing types of DUTs and technologies. Additionally, a variable-loop-path ring oscillator test circuit of the present disclosure is not limited to determining access time, setup time and hold time. Rather, a variable-loop-path ring oscillator test circuit of the present disclosure may be modified for determining other device characteristics, such as, but not limited to, recovery time, and removal time.

Figure 3:
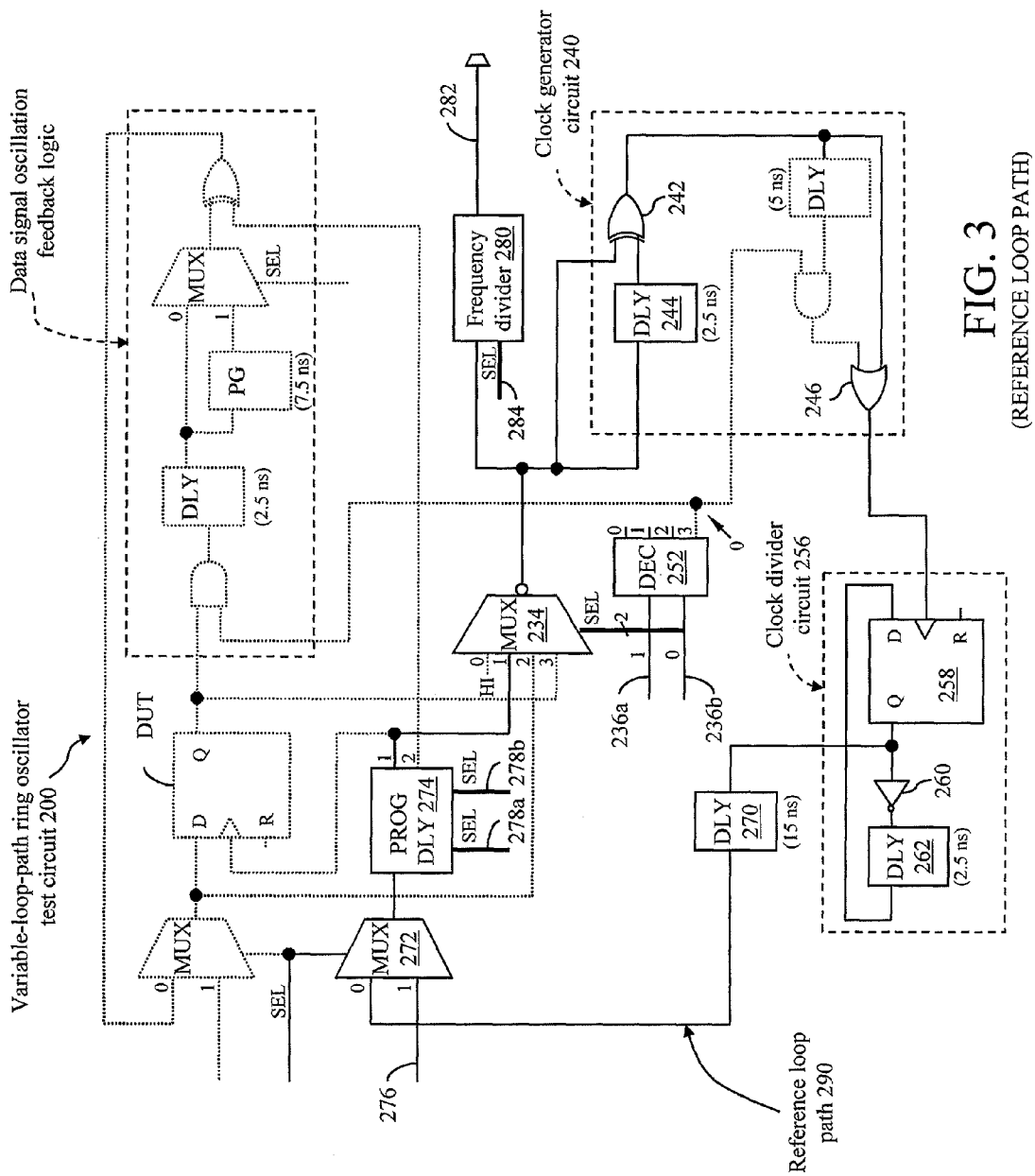
FIG. 3 is a view of the diagram of FIG. 2 that highlights the reference loop path of the variable-loop-path ring oscillator test circuit.

FIG. 3 shows variable-loop-path ring oscillator test circuit 200 of FIG. 2 in a manner that highlights the reference loop path 290 (corresponding to reference loop path 116 of FIG. 1). In FIG. 3, the elements of variable-loop-path ring oscillator test circuit 200 shown in continuous lines are the elements that are active during the REFERENCE LOOP mode of the variable-loop-path ring oscillator test circuit and, hence, form reference loop path 290. The elements that are not active during REFERENCE LOOP mode, and consequently are not part of reference loop path 290, are shown in dotted lines. As seen in FIG. 3, the primary active components of reference loop path 290, in loop order, are MUX 234, delay 244, XOR gate 242, OR gate 246, clock divider circuit 256 (which includes D flip-flop 258, inverter 260 and delay 262), delay 270, MUX 272 and programmable delay 274. Decoder 252 is shown as active because it receives the same select inputs 236a-b as MUX 234. Frequency divider 280 is also active because it drives I/O output 282 so as to enable the collection of frequency measurement data concerning reference loop path 290. In this example, select inputs 236a-b of MUX 234 are set to a binary 01 in order to select input 1 of MUX 234 that corresponds to reference loop path 290. In addition, it is noted that output 1 of programmable delay 274 is in reference loop path 290.

Figure 4:
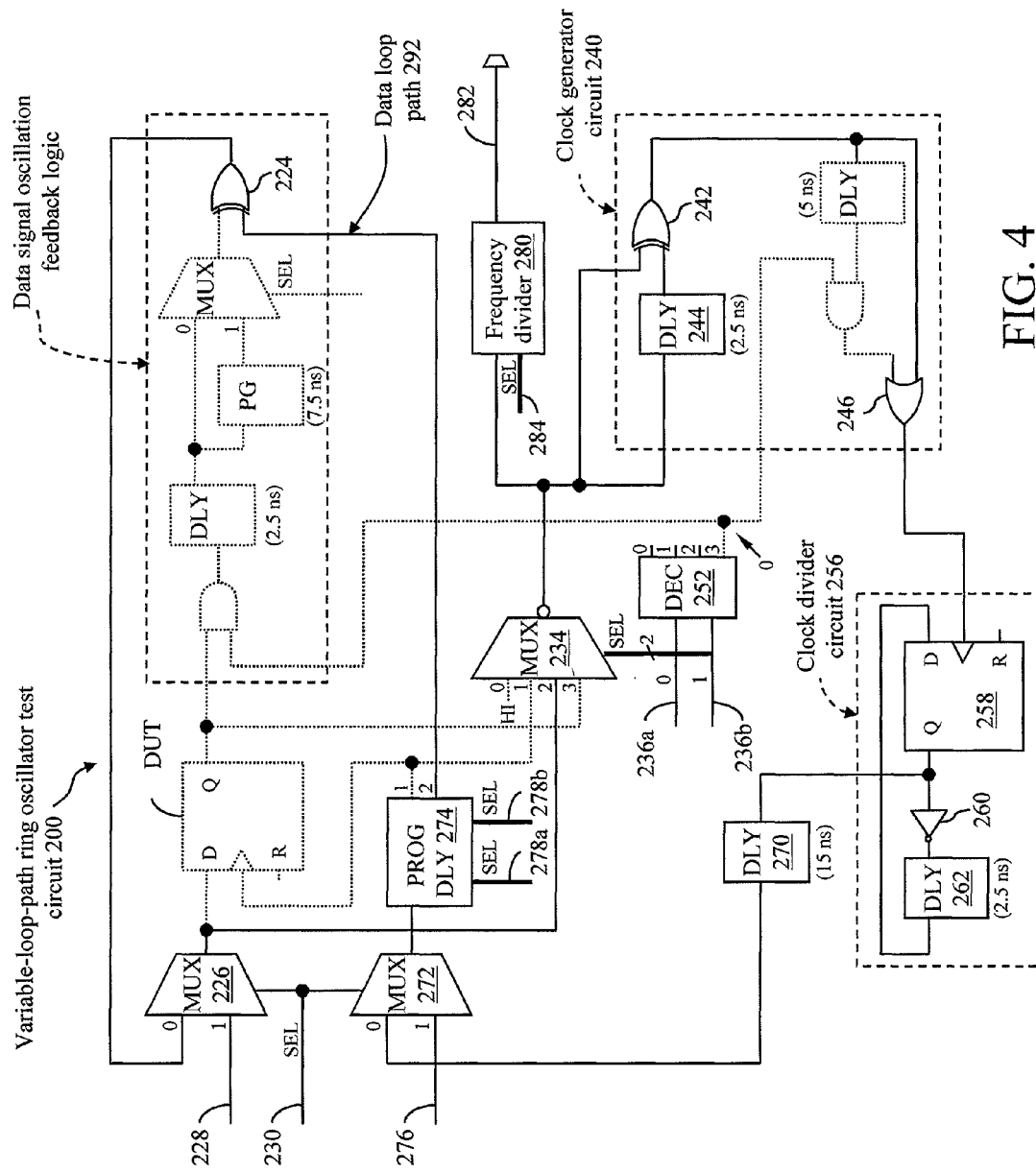
FIG. 4 is a view of the diagram of FIG. 2 that highlights the data loop path of the variable-loop-path ring oscillator test circuit.

FIG. 4 shows variable-loop-path ring oscillator test circuit 200 of FIG. 2 in a manner that highlights the data loop path 292 (corresponding to data loop path 120 of FIG. 1). In FIG. 4, the elements of variable-loop-path ring oscillator test circuit 200 shown in continuous lines are the elements that are active during the DATA LOOP mode of the variable-loop-path ring oscillator test circuit and, hence, form data loop path 292. The elements that are not active during DATA LOOP mode, and consequently are not part of reference loop path 292, are shown in dotted lines. As seen in FIG. 4, the primary active components of data loop path 290, in loop order, are MUX 234, delay 244, XOR gate 242, OR gate 246, clock divider circuit 256 (which includes D flip-flop 258, inverter 260 and delay 262), delay 270, MUX 272, programmable delay 274, XOR gate 224, MUX 226 and the D-input of DUT 204. Decoder 252 is shown as active because it receives the same select inputs 236a-b as MUX 234. Frequency divider 280 is also active because it drives I/O output 282 so as to enable the collection of frequency measurement data concerning reference loop path 290. In this example, select inputs 236a-b of MUX 234 are set to a binary 10 in order to select input 2 of MUX 234, which is the DATA LOOP path. In addition, it is noted that output 2 of programmable delay 274 is in data loop path 292.

Figure 5:
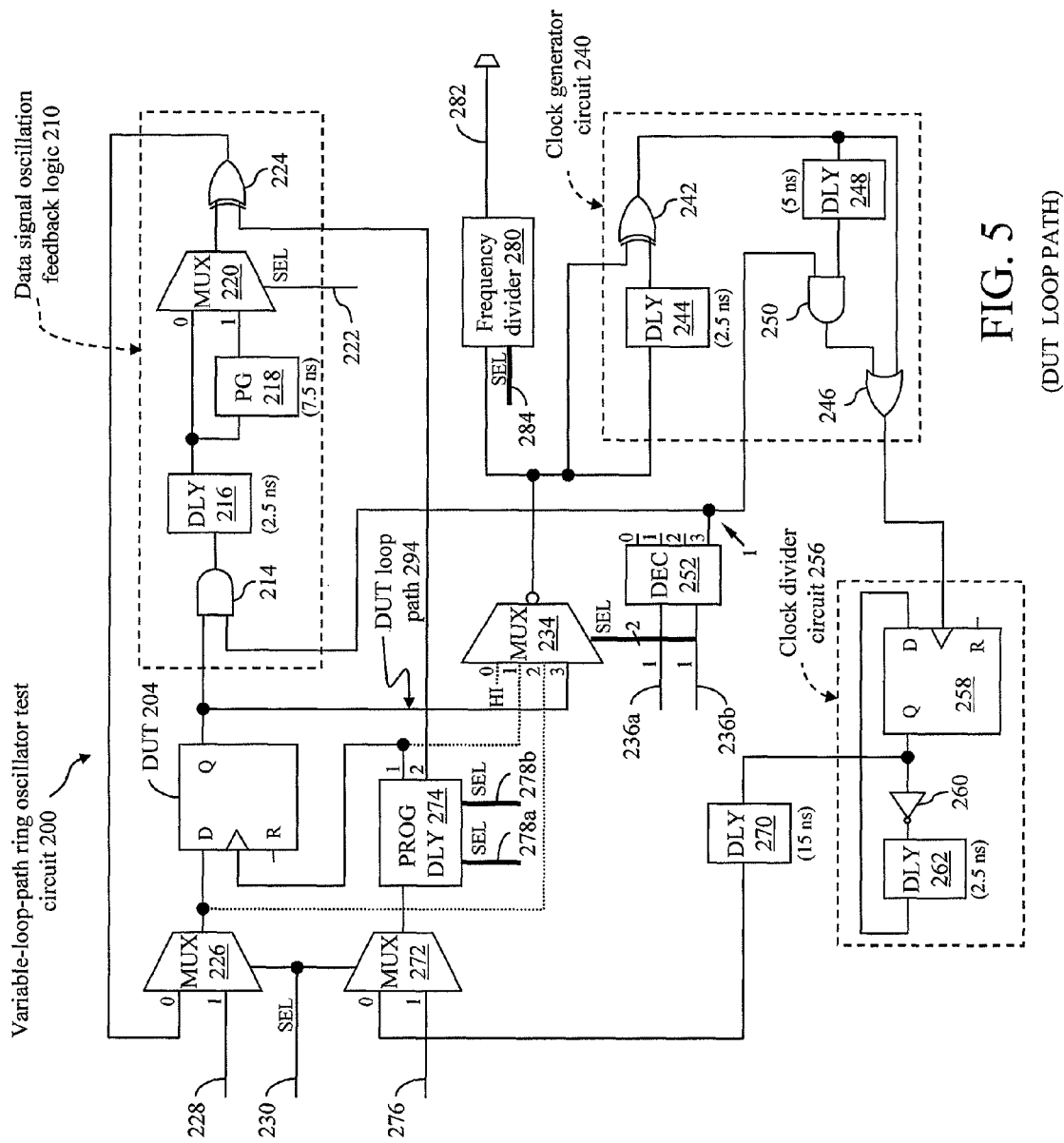
FIG. 5 is a view of the diagram of FIG. 2 that highlights the DUT loop path of the variable-loop-path ring oscillator test circuit.

FIG. 5 illustrates the state of variable-loop-path ring oscillator test circuit 200 of FIG. 2 when it is in DUT MODE, i.e., when the DUT loop path 294. In DUT MODE, all of the elements of variable-loop-path ring oscillator test circuit 200 are active. Therefore, none of the elements are shown in dotted lines. While the entirety of variable-loop-path ring oscillator test circuit 200 is active, it is noted that not all of the elements make up DUT loop path 294. Rather, the elements that for DUT loop path 294, in loop order, are as follows: MUX 234, delay 244, XOR gate 242, OR gate 246, clock divider circuit 256 (which includes D flip-flop 258, inverter 260 and delay 262), delay 270, MUX 272, programmable delay 274 and DUT 204, which includes both the D-input and Q-output of DUT 204. Additional elements that are active, but are not part of DUT loop path 294 include: delay 248 and AND gate 250 that are part of clock generator circuit, and AND gate 214, delay 216, pulse generator 218 and MUX 220 that are all part of feedback logic 210. Decoder 252 is shown as active because it receives the same select inputs 236a-b as MUX 234, and frequency divider 280 is also active because it drives I/O output 282 so as to enable the collection of frequency measurement data concerning reference loop path 290. In this example, select inputs 236a-b of MUX 234 are set to a binary 11 in order to select input 3 of MUX 234, which is for DUT loop path 294. In addition, it is noted that output 1 of programmable delay 274 drives the clock input of DUT 204 and that output 2 of the programmable delay is used in feedback logic 210 for ensuring the D-input of DUT 204 is properly stimulated with an oscillating signal.

Referring to FIGS. 2-5, for certain types of DUTs, such as, but not limited to, certain types of D flip-flops, the calculations that may be performed by test algorithm 168 (FIG. 1) may include, but are not limited to, the following.

Access time=[(period of DUT LOOP)−(period of REFERENCE LOOP)]÷x;

Setup time=[(period of REFERENCE LOOP)−(period of DATA LOOP)]÷x; and

Hold time=[(period of DATA LOOP)−(period of REFERENCE LOOP)]÷x where x is the program value of frequency divider 280. For example, if frequency divider 280 is programmed to divide by 64, x=64; alternatively, if frequency divider 280 is programmed to divide by 1, x=1; and where the "period" of each loop is derived from measuring the frequency at I/O pin 282 by use of, for example, frequency measuring device 152 of FIG. 1. More details of an example method of using a variable-loop-path ring oscillator test circuit made in accordance with concepts of the present disclosure, such as test circuit 100 of FIG. 1 and test circuit 200 of FIG. 2, are described next in connection with FIG. 6.

Figure 6:
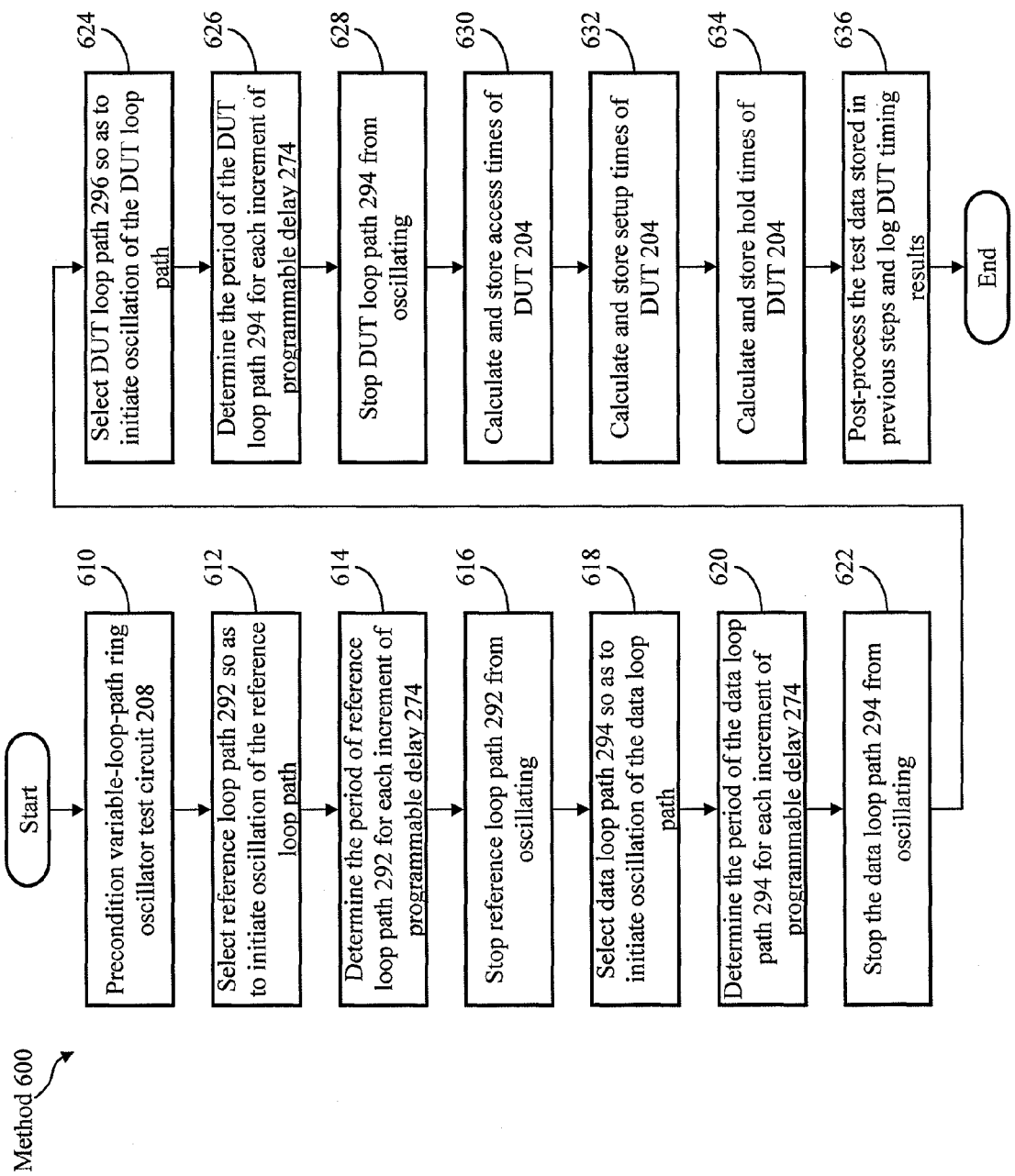
FIG. 6 is a flow diagram of a method of using the variable-loop-path ring oscillator test circuit of FIG. 2 for determining timing characteristic parameter values of an as-manufactured digital circuit element.

FIG. 6 illustrates a method 600 of using variable-loop-path ring oscillator test circuit 200 of FIGS. 2-5 and tester 148 of FIG. 1 to perform model-to-hardware correlation in integrated circuit design and test applications. It is noted that although method 600 is described in the context of variable-loop-path ring oscillator test circuit 200, those skilled in the art will understand how to implement the broad and general concepts of method 600 to implement other methods and utilize variable-loop-path oscillators other than variable-loop-path ring oscillator test circuit 200. For convenience, method 600 is an example involving the determination of the timing characteristics of access time, setup time and hold time of a D type flip-flop, which is the type of DUT 204 shown in FIGS. 2-5. Method 600 may include, but is not limited to, the steps described below.

Figure 7:
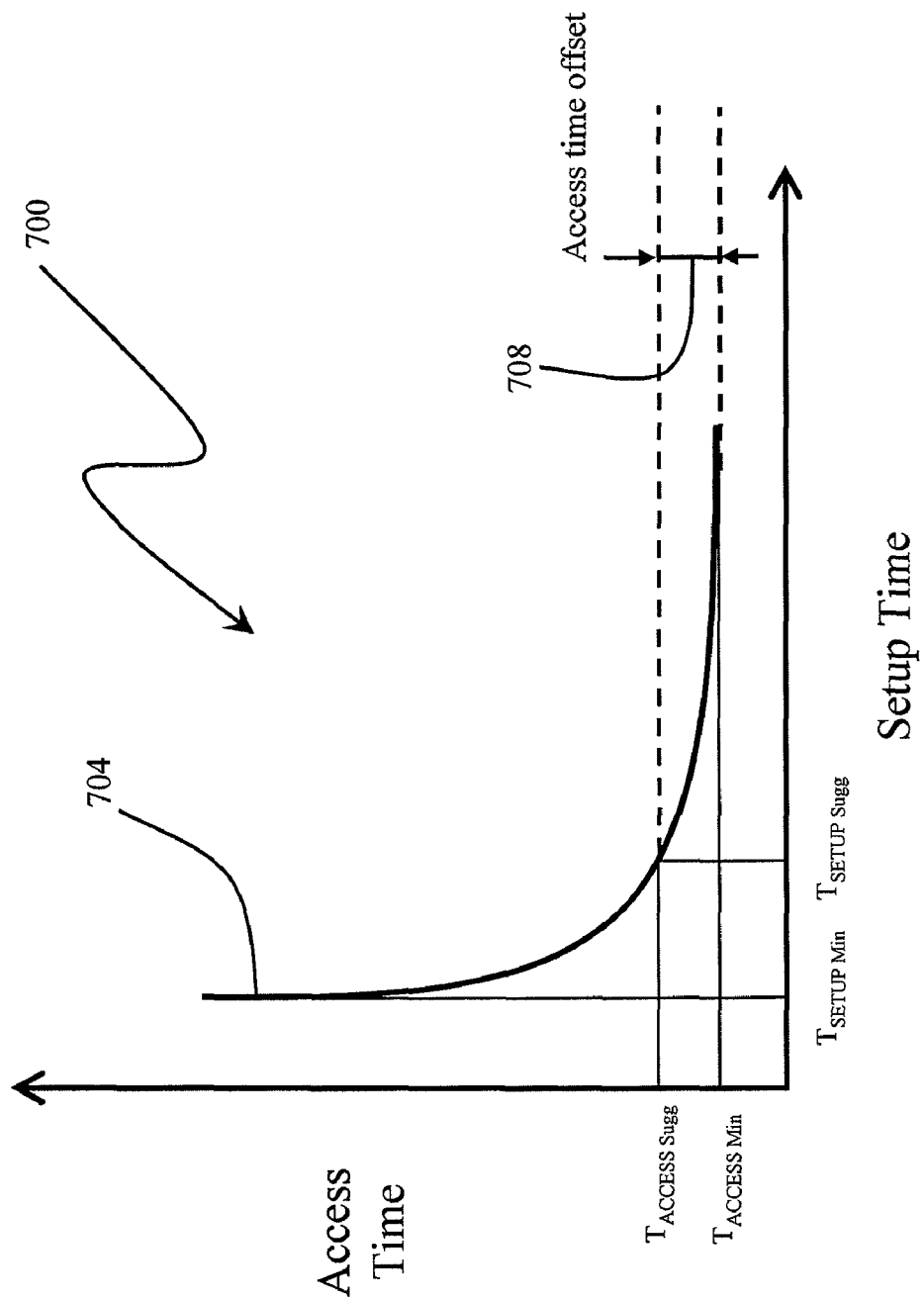
FIG. 7 is a graph of access time versus setup time for an example D-flip-flop.

Prior to proceeding with describing example method 600, attention is first directed to FIG. 7, which shows a graph 700 of access time versus setup time that is representative of the behavior of a typical conventional D type flip-flop, which is used above in describing variable-loop-path ring oscillator test circuit 200 of FIGS. 2-5. Graph 700 is presented to visualize concepts described below in connection with method 600. It is noted that while graph 700 is directed to access time versus setup time, similar graphs can be made for access time versus hold time and for other combinations of timing characteristics. A graph of access time versus hold time for the D type flip-flop that produced graph 700 is similar to graph 700, but the transition between the vertical and horizontal asymptotes of the curve is somewhat steeper than the transition of curve 704.

As seen in FIG. 7, curve 704 indicates that the corresponding D type flip-flop has a minimum access time $T_{ACCESS\ Min}$ and a minimum setup time $T_{SETUP\ Min}$. At minimum access time $T_{ACCESS\ Min}$, the corresponding setup time is relatively very long. Similarly, at minimum setup time $T_{SETUP\ Min}$, the corresponding access time is relatively very long. While it is desirable to minimize the value of access time provided to designers, care must be taken in not providing a design value that is too low (and correspondingly a setup time that is too high). Prior to the present inventive concepts embodied in the present disclosure, to the inventors' knowledge there has been no practical way to ensure proper design values were being provided to circuit designers, let alone design values that have been verified by testing of as-manufactured devices. However, features of the broad concepts disclosed herein allow for selecting one timing characteristic as a function of another. In the example of FIG. 7, these features allow selection of a suggested (or publishable) setup time design value $T_{SETUP\ Sugg}$ (which may be taken as a minimum design value) based on the value of minimum access time $T_{ACCESS\ Min}$ as determined using a variable-loop-path ring oscillator circuit made in accordance with broad concepts of the present disclosure. This can be accomplished by selecting an appropriate access time offset 708 from the determined minimum access time value $T_{ACCESS\ Min}$ and using the corresponding value of the setup time, i.e., $T_{SETUP\ Sugg}$. If desired, the value of access time, i.e., $T_{ACCESS\ sugg}$, at the suggested (minimum) setup time value $T_{SETUP\ Sugg}$ may be used as the (minimum) suggested access time value. A corresponding suggested value of hold time (not shown) may also be determined as a function of the determined minimum access time value $T_{ACCESS\ Min}$ as described below in connection with method 600.

Referring now to FIG. 6, and also to FIGS. 1-5 as indicated, at step 610 variable-loop-path ring oscillator test circuit 200 (FIG. 2) is preconditioned. For example, MUX 234 is set to DISABLE mode via select inputs 236*a-b* (e.g., set to binary 00), which sets the output of MUX 234 to, for example, a logic low because input 0 is a logic high. Additionally, the Q-outputs of DUT 204 and D flip-flop 258 of clock divider circuit 256 are preconditioned to a logic low. DUT 204 may be preconditioned by use of MUXs 226, 272, which may provide the data and clock, respectively, during this preconditioning step. Similar MUXs (not shown) may be used to precondition D flip-flop 258. Alternatively, the reset inputs (if available) of DUT 204 and D flip-flop 258 may be used to precondition their respective Q-outputs. Furthermore, frequency divider 280 is programmed to a user-desired value. In this example, frequency divider 280 is programmed to divide by 64.

At step 612, reference loop path 292 (FIG. 3) is selected, which initiates oscillation of this path of variable-loop-path ring oscillator test circuit 200. More specifically, the delay value of output 1 of programmable delay 274 is set to an initial value. Preferably, though not necessarily, this delay value is selected so that the oscillation of DUT loop path 296 ceases to oscillate at midrange of the delay range. The delay value of output 2 of programmable delay 274 is essentially a "don't care" value, since output 2 is not part of reference loop path 292. Subsequently, MUX 234 is set to REFERENCE LOOP mode via select inputs 236*a-b* (e.g., set to binary 01), which causes the output of MUX 234 to transition from a logic low to a logic high and, thereby, initiate the oscillation within reference loop path 292. Once reference loop path 292 is oscillating, the output 282 of variable-loop-path ring oscillator test circuit 200 is monitored by, for example, frequency measuring device 152 of FIG. 1.

At step 614, the frequency of oscillation of reference loop path 292 is measured and the period of the reference loop path is determined. This can be accomplished, for example, using tester 148 of FIG. 1. As will be seen below, during testing, part or all of the range of delay values for output 2 of programmable delay 274 will be swept as the delay value for output 1 remains fixed. However, prior to testing, part or all of the range of delay values for output 1 may be swept, for example, as part of a setup procedure used to determine the optimal delay value for output 1 for the testing.

At step 616, the oscillation of reference loop path 292 is stopped. In this embodiment, this is accomplished by setting MUX 234 to DISABLE mode via select inputs 236*a-b* (e.g., set to binary 00), which sets the output of MUX 234 to a logic low, thereby stopping the oscillation of the reference loop path. Substantially the same tasks of preconditioning step 610 are then repeated in this step.

At step 618, data loop path 294 (FIG. 4) is selected, which initiates oscillation of this path of variable-loop-path ring oscillator test circuit 200. More specifically, the delay value of output 2 of programmable delay 274 is set to an initial value, such as to the minimum delay. The delay value of output 1 of programmable delay 274 is essentially a "don't care" value. Subsequently, MUX 234 is set to DATA LOOP mode via select inputs 236*a-b* (e.g., set to binary 10), which causes the output of MUX 234 to transition from a logic low to a logic high and, thereby, initiate the oscillation within data loop path 294. Once data loop path 294 is oscillating, the output 282 of variable-loop-path ring oscillator test circuit 200 is monitored by, for example, frequency measuring device 152 of FIG. 1.

At step 620, the frequency of oscillation of data loop path 294 is measured and the period of the data loop path is determined for each increment of the programmable delay. This can be accomplished, for example, using tester 148 of FIG. 1. For example, the period of data loop path 294 is measured and stored for each increment of output 2 of programmable delay 274, for example, starting at the minimum delay value and incrementing stepwise to the maximum delay value. In particular, for each increment of output 2 of programmable delay 274, the period may be measured via frequency measuring device 130 of FIG. 1 and stored in an appropriate data store.

At step 622, the oscillation of data loop path 294 is stopped. In this embodiment, this is accomplished by setting MUX 234 to DISABLE mode via select inputs 236*a-b* (e.g., set to binary 00), which sets the output of MUX 234 to a logic low, thereby stopping the oscillation of the data loop path. Substantially the same tasks of preconditioning step 610 are then repeated in this step.

At step 624, DUT loop path 296 (FIG. 5) is selected, which initiates oscillation of this path of variable-loop-path ring oscillator test circuit 200. More specifically, the delay value of output 2 of programmable delay 274 is set to an initial value, such as to the minimum delay. The delay value of output 1 of programmable delay 274 is set to a value that will remain fixed, such as to a mid-range delay value. Additionally, MUX 220 is selected via select signal 222 according to the timing that is needed for the DUT at issue. In one example, when DUT 204 is a D-flip-flop, as shown in FIG. 2, input 0 of MUX 220 may be selected. In another example, when DUT 204 is a D latch (not shown), input 1 of MUX 220 may be selected. Subsequently, MUX 234 is set to DUT LOOP mode via select inputs 236*a-b* (e.g., set to binary 11), which causes the output of MUX 234 to transition from a logic low to a logic high and, thereby, initiate the oscillation within DUT loop path 296. Because DUT loop path 296 is selected, the pulse doubling mode of clock generator circuit 240 is enabled. Once DUT loop path 294 is oscillating, the output 282 of variable-loop-path ring oscillator test circuit 200 is monitored by, for example, frequency measuring device 152 of FIG. 1.

At step 626, the frequency of oscillation of DUT loop path 296 is measured and the period of the DUT loop path is determined for each increment of the programmable delay. This can be accomplished, for example, using tester 148 of FIG. 1. For example, the period of DUT loop path 296 is measured and stored for each increment of output 2 of programmable delay 274, for example, starting at the minimum delay value and incrementing stepwise to the maximum delay value, while the delay value of output 1 remains fixed. In particular, for each increment of output 2 of programmable delay 274, the period may be measured via frequency measuring device 152 of FIG. 1 and stored in an appropriate data store.

At step 628, the oscillation of DUT loop path 296 is stopped. In this embodiment, this is accomplished by setting MUX 234 to DISABLE mode via select inputs 236*a*-*b* (e.g., set to binary 00), which sets the output of MUX 234 to a logic low, thereby stopping the oscillation of the DUT loop path. Substantially the same tasks of preconditioning step 610 are then repeated in this step.

At step 630, the access time of DUT 204 is calculated and stored. For example, for each increment of programmable delay 274, the access time is calculated by tester 148 of FIG. 1 using test algorithm 168 and stored in an appropriate data store. More specifically, for each increment of programmable delay 274, the access time may be calculated by tester 148 according to the equation:

Access time=[(period of DUT loop path 296)−(period of reference loop path 292)]÷64 wherein 64 is the programmed value of frequency divider 280 as set in step 610.

At step 632, the setup time of DUT 204 is calculated and stored. For example, for each increment of programmable delay 274, the setup time is calculated by tester 148 of FIG. 1 using test algorithm 168 and stored in an appropriate data store. More specifically, for each increment of programmable delay 274, the setup time may be calculated by tester 148 according to the equation:

Setup time=[(period of reference loop path 292)−(period of data loop path 294)]÷64 wherein 64 is the programmed value of frequency divider 280 as set in step 610.

At step 634, the hold time of DUT 204 is calculated and stored. For example, for each increment of programmable delay 274, the hold time is calculated by tester 148 of FIG. 1 using test algorithm 168 and stored in an appropriate data store. More specifically, for each increment of programmable delay 274, the hold time may be calculated by tester 248 according to the equation:

Hold time=[(period of data loop path 294)−(period of reference loop path 292)]÷64 wherein 64 is the programmed value of frequency divider 280 as set in step 610.

At step 636, the test data stored in the steps 630, 632, 636 is post-processed and the resulting timing characteristics of DUT 204 are logged. The Table below shows an example subset of test data for a certain DUT used as DUT 204. For example, the Table shows the period data acquired in steps 614, 620, 626. Additionally, Table shows data resulting from the calculations performed at steps 630, 632, 634. In this step of post-processing the data, test algorithm 168 of FIG. 1 searches the data for the first point at which no oscillation is detected on the DUT loop path 296 (FIG. 5), i.e., searches for the failure point of the DUT loop path, and determines the setup and hold time based upon the failure point. Additionally, test algorithm 168 of FIG. 1 searches the data for the point at which a certain percent increase (e.g., 10%) in access time relative to the minimum determined access time is indicated. (This increase corresponds to access time offset 708 in graph 700 of FIG. 7.)

The Table shows eleven entries of measurement data and resulting calculations, ranging from mid-range minus five increments (of programmable delay 274) to mid-range plus five increments. This is only a portion of the total data acquired in steps 614, 620, 626. In this example, the first failure point of DUT loop path 196 is found at entry #8, where the failure point of the DUT loop path is indicated as no oscillation ("no osc"). In this example, the failure is due to the violation of the setup and/or hold time of DUT 204. It may be concluded, therefore, that the actual setup time of DUT 204 is the setup time that is calculated one step previous to this failure point. In the example of the Table, the setup time of DUT 204 is, therefore, about 0.095 ns, which is at entry #7. It may also be concluded that the actual hold time for DUT 204 is the hold time that is calculated at the failure point itself. In this example, the hold time of DUT 204 is, therefore, about −0.079 ns, which is at entry #8. Furthermore, the Table shows that the access time is substantially constant for a certain number of entries, such as entries #1 through #3. In this example, the access time of DUT 204 is substantially constant as long as the setup and/or hold time are not in violation. However, as the setup time approaches the failure point, it is observed that DUT 204 exhibits a gradual increase in access time. For example, at entry #4 the access time has increased by about 4%, then by about 6% at entry #5, then by about 10% at entry #6, then by about 14% at entry #7, and then failure at entry #8.

Note: Referring to the Table, the error in the calculations is about +/− the value of the fine resolution of programmable delay 274. For example, if the fine resolution of programmable delay 274 is about 10 ps, the error in all calculations is about +/−10 ps.

TABLE

| | Loop | Period (μs) | Delay value | Freq. Div. | Access Time (ns) | Access Time % Change | Setup time (ns) | Hold time (ns) |
|---|---|---|---|---|---|---|---|---|
| 1 | REF | 2.6371 | Mid-range −5 | 64 | 0.358 | 0% | 0.216 | −0.216 |
|   | DATA | 2.6233 | Mid-range −5 | 64 | | | | |
|   | DUT | 2.6600 | Mid-range −5 | 64 | | | | |
| 2 | REF | 2.6381 | Mid-range −4 | 64 | 0.359 | 0% | 0.195 | −0.195 |
|   | DATA | 2.6256 | Mid-range −4 | 64 | | | | |
|   | DUT | 2.6600 | Mid-range −4 | 64 | | | | |
| 3 | REF | 2.6381 | Mid-range −3 | 64 | 0.360 | 0% | 0.174 | −0.174 |
|   | DATA | 2.6270 | Mid-range −3 | 64 | | | | |

TABLE-continued

Example test data for a certain DUT

| Loop | Period (μs) | Delay value | Freq. Div. | Access Time (ns) | Access Time % Change | Setup time (ns) | Hold time (ns) |
|---|---|---|---|---|---|---|---|
| DUT | 2.6611 | Mid-range −3 | 64 | | | | |
| 4 REF | 2.6371 | Mid-range −2 | 64 | 0.373 | 4% | 0.153 | −0.153 |
| DATA | 2.6273 | Mid-range −2 | 64 | | | | |
| DUT | 2.6610 | Mid-range −2 | 64 | | | | |
| 5 REF | 2.6381 | Mid-range −1 | 64 | 0.380 | 6% | 0.136 | −0.136 |
| DATA | 2.6294 | Mid-range −1 | 64 | | | | |
| DUT | 2.6620 | Mid-range −1 | 64 | | | | |
| 6 REF | 2.6371 | Mid-range +0 | 64 | 0.395 | 10% | 0.113 | −0.113 |
| DATA | 2.6299 | Mid-range +0 | 64 | | | | |
| DUT | 2.8900 | Mid-range +0 | 64 | | | | |
| 7 REF | 2.6381 | Mid-range +1 | 64 | 0.409 | 14% | 0.095 | −0.095 |
| DATA | 2.6320 | Mid-range +1 | 64 | | | | |
| DUT | 2.6643 | Mid-range +1 | 64 | | | | |
| 8 REF | 2.6371 | Mid-range +2 | 64 | no osc | n/a | 0.079 | −0.079 |
| DATA | 2.6320 | Mid-range +2 | 64 | | | | |
| DUT | 0.0000 | Mid-range +2 | 64 | | | | |
| 9 REF | 2.6380 | Mid-range +3 | 64 | no osc | n/a | 0.060 | −0.060 |
| DATA | 2.6342 | Mid-range +3 | 64 | | | | |
| DUT | 0.0000 | Mid-range +3 | 64 | | | | |
| 10 REF | 2.6360 | Mid-range +4 | 64 | no osc | n/a | 0.046 | −0.046 |
| DATA | 2.6330 | Mid-range +4 | 64 | | | | |
| DUT | 0.0000 | Mid-range +4 | 64 | | | | |
| 11 REF | 2.6371 | Mid-range +5 | 64 | no osc | n/a | 0.021 | −0.021 |
| DATA | 2.6358 | Mid-range +5 | 64 | | | | |
| DUT | 0.0000 | Mid-range +5 | 64 | | | | |

Referring still to the above Table, a percent (%) change in access time is shown. This percent-change is compared with the substantially constant access time that DUT 204 exhibits when there is no violation of the setup and/or hold time. For example, the Table shows a substantially constant access time of about 0.359 ns. The percent-change in access time may be useful for correlating the hardware performance to the published specifications of the software models. For example, when approaching the failure point of DUT loop path 296, there may be a sudden increase in access time. A designer may establish a target published setup time value to be the point at which a certain percent-change in access time occurs as measured by use of a ring oscillator test circuit made in accordance with broad concepts of the invention. In one example, the published setup time value of a certain DUT type should be greater than or equal to the access time at which, for example, a 10% increase in access time is measured in actual hardware via the ring oscillator test circuit of the invention. Referring again to the Table, if the setup time at which the 10% change in access time occurs is chosen to validate the published setup time of a certain DUT type, the setup time of DUT 204 of method 600 is 0.113 ns, which is entry #6. Furthermore, entry #7 validates the published setup time of 0.113 ns of entry #6, because the setup time at entry #7, which is one step before failure, is slightly less than the setup time at entry #6.

Referring to the foregoing Table and the example of method 600 of FIG. 6, the measured access time of DUT 204, which in this example is a D type flip-flop, is about 0.359 ns, the measured setup time is about 0.113 ns, and the measured hold time is about −0.079 ns. Therefore, for the corresponding D type flip-flop in the associated design library, the published access time value is preferably greater than or equal to about 0.359 ns, the published setup time is preferably greater than or equal to about 0.113 ns, and the published hold time is preferably greater than or equal to about −0.079 ns.

Again, the measurement data and calculations are not limited to those described method 600. Rather, other measurement data and calculations are within the scope of the present disclosure. In one example, for a certain type of DUT, instead of obtaining the period of the oscillation of the ring oscillator loop paths, the pulse width may be obtained. Consequently, instead of using the period in the calculations, the pulse width may be used. In one example, when DUT 204 is a latch device instead of a D flip-flop, the positive pulse width at output 282 may be obtained via frequency measuring device 152 of FIG. 1. Additionally, the frequency divide-by value for a latch device may be equal to 1, instead of 64 as used in the foregoing example of the Table above. Alternatively, the access time, setup time, and hold time formulas for a latch device that are used in method steps 630, 632, 634, respectively, may be, for example, as follows.

Access time=[(pulse width of DUT loop path 296)−
(pulse width of reference loop path 292)]÷1;

Setup time=[(pulse width of reference loop path 292)−
(pulse width of data loop path 294)]÷1; and Hold time=[(pulse width of data loop path 294)−
(pulse width of reference loop path 292)]÷1, where 1 in each of the foregoing equations is the programmed value of frequency divider 280 as set in step 610.

Referring again to FIG. 6, the various loop paths may be initiated and measured in any order, i.e., the groupings of method steps 612, 614, 616, method steps 618, 620, 622, and method steps 624, 626, 628 may be executed in any order. Furthermore, the various calculations may be executed in any order, order, i.e., method steps 630, 632, 634 may be executed in any order.

While one method of using the ring oscillator test circuit of the invention is to iterate through all values of programmable delay 274 and then process the data has been described in method 600, those skilled in the art will readily understand that alternative ways of using a variable-loop-path ring oscillator test circuit of the present disclosure are possible. For example, in an automated test environment it may be beneficial to optimize test time by executing a subset only of the values of programmable delay 274. For example, during prototype testing, it may be determined that executing a certain window only within the range of programmable delay 274 is suitable for capturing a suitable number of data acquisitions before and after the failure point of the DUT. As a result, a only subset of data, as compared with executing all values of programmable delay 274, is post processed. In another example, data may be processed in real time, in order to detect in real time the certain access time increase and/or failure point of the DUT. In this case, the test may be suspended in real time once the failure point of the DUT is detected and then the test sequence moves to the next DUT of interest.

Furthermore, while variable-loop-path ring oscillator test circuit 200 of FIGS. 2, 3, 4 and 5 and method 600 of FIG. 6 illustrate the use of a variable-loop-path ring oscillator test circuit made in accordance with the present disclosure in conjunction with testing a D-type flip-flop, those skilled in the art will understand that the selection of a D flip-flop was arbitrary for the purpose of providing an example. As mentioned above, a variable-loop-path ring oscillator test circuit and method in accordance with the present disclosure may be modified for testing other types of digital circuit elements, such as, but not limited to, other types of flip-flops, latches and memory cells.

As mentioned above, FIG. 8 shows for the sake of illustration a computer system 800 within which a set of instructions for causing a test circuit, such as test circuit 200 of FIG. 2, to perform any one or more of the aspects and/or methodologies of the present disclosure may be executed. Those skilled in the art will recognize that this example is for a test circuit controlled by an external tester. Such an external tester may interface with the test circuit aboard a wafer/chip, for example, via test pads on the wafer/chip, by wireless communication or any other way known in the art. In an extreme external tester example, computer system 800 may perform all test circuit stimulation and control, as well as collect all relevant test data. Those skilled in the art will also readily appreciate that some or all of the functionality of computer system 800 relative to controlling the test circuit under consideration may be performed using built-in self-test BIST circuitry (not shown). In an extreme BIST example, all testing functionality may be carried out by the BIST circuitry and test circuit, will only final results being communicated off-wafer/off-chip. Thus, computer system 800 is provided simply to illustrate one of many means that can be used to implement novel methodologies of the present disclosure. Those skilled in the appropriate art(s) will readily understand how to utilize computer system 800 to implement methodologies of the present disclosure, as would they understand how to implement such methodologies in other environments, such as an automated testing equipment, a BIST environment and any combination thereof.

Computer system 800 includes a processor 804 (e.g., a microprocessor) (more than one may be provided) and a memory 808 that communicate with each other, and with other components, via a bus 812. Bus 812 may include any of several types of bus structures including, but not limited to, a memory bus, a memory controller, a peripheral bus, a local bus, and any combination thereof, using any of a variety of bus architectures well known in the art. Memory 808 may include various components including, but not limited to, a random access read/write memory component (e.g., a static RAM (SRAM), a dynamic RAM (DRAM), etc.), a read-only component, and any combination thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of instruction sets including, but not limited to, an operating system, one or more application programs, other program modules, program data, and any combination thereof.

Computer system 800 may also include one or more storage devices 824. Examples of storage devices suitable for use as any one of the storage devices 824 include, but are not limited to, a hard disk drive device that reads from and/or writes to a hard disk, a magnetic disk drive device that reads from and/or writes to a removable magnetic disk, an optical disk drive device that reads from and/or writes to an optical media (e.g., a CD, a DVD, etc.), a solid-state memory device, and any combination thereof. Each storage device 824 may be connected to bus 812 by an appropriate interface (not shown). Example interfaces include, but are not limited to, Small Computer Systems Interface (SCSI), advanced technology attachment (ATA), serial ATA, universal serial bus (USB), IEEE 13144 (FIREWIRE), and any combination thereof. In one example, storage device 824 may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data and/or data storage for computer system 800. In one example, instructions 820 may reside, completely or partially, within machine-readable medium 828. In another example, instructions 820 may reside, completely or partially, within processor 804.

In some embodiments, such as a general purpose computer, computer system 800 may also include one or more input devices 832. In one example, a user of computer system 800 may enter commands and/or other information into the computer system via one or more of the input devices 832. Examples of input devices that can be used as any one of input devices 832 include, but are not limited to, an alpha-numeric input device (e.g., a keyboard), a pointing device, a joystick, an audio input device (e.g., a microphone, a voice response system, etc.), a cursor control device (e.g., a mouse), a touchpad, an optical scanner, a video capture device (e.g., a still camera, a video camera), touchscreen, a digitizer pad, and any combination thereof. Each input device 832 may be interfaced to bus 812 via any of a variety of interfaces (not shown) including, but not limited to, a serial interface, a parallel interface, a game port, a Universal Serial Bus (USB) interface, a FIREWIRE interface, a direct interface to the bus, a wireless interface (e.g., a Bluetooth® connection) and any combination thereof.

Commands and/or other information may be input to computer system 800 via storage device 824 (e.g., a removable disk drive, a flash drive, etc.) and/or one or more network interface devices 836. A network interface device, such as network interface device 836, may be utilized for connecting computer system 800 to one or more of a variety of networks, such as network 840, and one or more remote devices 844 connected thereto. Examples of a network interface device include, but are not limited to, a network interface card, a modem, a wireless transceiver (e.g., a Bluetooth® transceiver) and any combination thereof. Examples of a network include, but are not limited to, a wide area network (e.g., the Internet, an enterprise network), a local area network (e.g., a network associated with an office, a building, a campus, a group of wireless sensors or other group of data streaming devices, or other relatively small geographic space), a telephone network, a direct connection between two computing devices, and any combination thereof. A network, such as network 840, may employ a wired and/or a wireless mode of communication. In general, any network topology may be used. Information (e.g., data, instructions 820, etc.) may be communicated to and/or from computer system 800 via the one or more network interface devices 836.

In some embodiments, such as a general purpose computer, computer system 800 may further include a video display adapter 848 for communicating a displayable image to a display device, such as display device 852. Examples of a display device include, but are not limited to, a liquid crystal display (LCD), a cathode ray tube (CRT), a plasma display, and any combination thereof. In addition to a display device, a computer system 800 may include one or more other peripheral output devices including, but not limited to, an audio speaker, a printer, and any combination thereof. Such peripheral output devices may be connected to bus 812 via a peripheral interface 856. Examples of a peripheral interface include, but are not limited to, a serial port, a USB connection, a FIREWIRE connection, a parallel connection, and any combination thereof.

A digitizer (not shown) and an accompanying pen/stylus, if needed, may be included in order to digitally capture freehand input. A pen digitizer may be separately configured or coextensive with a display area of display device 852. Accordingly, a digitizer may be integrated with display device 852, or may exist as a separate device overlaying or otherwise appended to the display device.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of obtaining one or more timing characteristic data for an as-manufactured digital storage element having a first input, a second input and an output, comprising:
    varying a first delay within a first ring-oscillator path among a plurality of delay values, the first ring-oscillator path including the first input and the output of the as-manufactured digital storage element and having an oscillation state at each of the plurality of delay values;
    during said varying of the first delay, applying a constant frequency signal of a particular value to the second input;
    collecting a first data set containing data on the oscillation state of the first ring-oscillator path for each of the plurality of delay values; and
    generating access time data for the as-manufactured digital storage element as a function of the data in the first data set and the particular value of the constant frequency signal.

2. A method according to claim 1, further comprising:
    operating a second ring-oscillator path at the particular value of the constant frequency signal; and
    measuring the particular value so as to obtain a measured value;
    wherein said generating of access time data includes determining a difference between each of the data in the first data set and the measured value.

3. A method according to claim 1, further comprising:
    varying a second delay within a second ring-oscillator path among the plurality of delay values, the second ring-oscillator path including the first input, but excluding the output of the as-manufactured digital storage element and having an oscillation state at each of the plurality of delay values;
    collecting a second data set containing data on the oscillation state of the second ring-oscillator path at each of the plurality of delay values; and
    generating timing characteristic data for the as-manufactured digital storage element as a function of the data in the second data set and the particular value of the constant frequency signal.

4. A method according to claim 3, further comprising:
    operating a third ring-oscillator path at the particular value of the constant frequency signal; and
    measuring the particular value so as to obtain a measured value;
    wherein said generating of timing characteristic data includes determining a difference between each of the data in the first data set and the measured value.

5. A method according to claim 4, wherein said generating of timing characteristic data includes generating setup time data.

6. A method according to claim 4, wherein said generating of timing characteristic data includes generating hold time data.

7. A method according to claim 1, wherein said collecting of said first data set includes obtaining a period of oscillation of the first ring-oscillator path for ones of the plurality of delay values.

8. A method according to claim 1, wherein said collecting of said first data set includes obtaining a pulse-width of the first ring-oscillator path for ones of the plurality of delay values.

9. A method according to claim 1, further comprising providing the as-manufactured digital storage element, wherein the as-manufactured digital storage element is selected from the group consisting of a latch, a flip-flop and a memory cell.

10. A method according to claim 1, further including:
    simultaneously with said varying of the first delay, conditioning an output signal from the output of the as-manufactured digital storage element so as to create a conditioned oscillating signal; and
    providing the conditioned oscillating signal to the first input of the as-manufactured digital storage element.

11. A method according to claim 1, wherein said collecting of the first data set includes measuring a frequency of the first ring-oscillator path for each of the plurality of delay values.

12. A method according to claim 1, wherein said collecting of the first data set includes dividing the frequency of the first ring-oscillator path by a divisor for each of the plurality of delay values.

13. A method of obtaining a timing characteristic design value for an as-manufactured digital storage element, comprising:
    applying first test signals to the as-manufactured digital storage element, wherein the first test signals have timings differing from one another;
    determining a set of access time values for the as-manufactured digital storage element based on corresponding respective ones of the first test signals applied to the as-manufactured digital storage element;
    applying second test signals to the as-manufactured digital storage element, wherein the second test signals have the timings of the first test signals;
    determining a set of timing characteristic values for the as-manufactured digital storage element based on corresponding respective ones of the second test signals so that ones of the set of timing characteristic values correspond to respective ones of the set of access time values; and selecting one of the set of timing characteristic values to be the timing characteristic design value as a function of the set of access time values.

14. A method according to claim 13, wherein said determining of the set of timing characteristic values includes determining a set of setup time values.

15. A method according to claim 13, wherein said determining of the set of timing characteristic values includes determining a set of hold time values.

16. A method according to claim 13, wherein:
said determining of the set of access time values includes determining at least one access time failure; and
said selecting of one of the plurality of timing characteristic values includes selecting one of the plurality of a timing characteristic value as a function of the at least one access time failure.

17. A method according to claim 13, wherein:
said determining of the set of access time values includes determining a minimum access time; and
said selecting of one of the plurality of timing characteristic values includes selecting one of the plurality of a timing characteristic value as a function of the minimum access time.

18. A method according to claim 17, wherein said selecting of one of the plurality of timing characteristic values includes determining an access timing offset relative to the minimum access time and selecting one of the plurality of timing characteristic values as a function of the access time offset.

19. A method according to claim 17, wherein said determining of the set of timing values includes determining the set of timing values as a function of 1) a set of second differing frequencies of a third ring-oscillator path that includes the data input and excludes the data output and 2) the particular frequency of the second ring-oscillator path.

20. A method according to claim 13, wherein the as-manufactured digital storage element includes a data input and a data output, and said determining of the set of access time values includes determining the set of access time values as a function of 1) a set of first differing frequencies of a first ring-oscillator path that includes the data input and data output and 2) a particular frequency of a second ring-oscillator path that excludes the data input and the data output.

21. A method according to claim 20, further comprising creating the set of first differing frequencies by varying a delay in the first ring-oscillator path.

22. A method according to claim 21, wherein said varying of the delay in the first ring-oscillator path includes varying the delay over a range containing at least one delay value that causes the first ring-oscillator path to not oscillate.

23. A method of obtaining a timing characteristic design value for an as-manufactured digital storage element, comprising:
applying first test signals to the as-manufactured digital storage element, wherein the first test signals have timings differing from one another;
measuring a first set of responses of the as-manufactured digital storage element to the first test signals applied to the as-manufactured digital storage element;
determining a set of access time values for the as-manufactured digital storage element based on the first set of responses;

applying second test signals to the as-manufactured digital storage element, wherein the second test signals have the timings of the first test signals;
measuring a second set of responses of the as-manufactured digital storage element to the second test signals applied to the as-manufactured digital storage element;
determining a set of timing characteristic values for the as-manufactured digital storage element based on the second set of responses so that ones of the set of timing characteristic values correspond to respective ones of the set of access time values; and
selecting one of the set of timing characteristic values to be the timing characteristic design value as a function of the set of access time values.

24. A method according to claim 23, wherein said determining of the set of timing characteristic values includes determining a set of setup time values.

25. A method according to claim 23, wherein said determining of the set of timing characteristic values includes determining a set of hold time values.

26. A method according to claim 23, wherein:
said determining of the set of access time values includes determining at least one access time failure; and
said selecting of one of the plurality of timing characteristic values includes selecting one of the plurality of a timing characteristic value as a function of the at least one access time failure.

27. A method according to claim 23, wherein:
said determining of the set of access time values includes determining a minimum access time; and
said selecting of one of the plurality of timing characteristic values includes selecting one of the plurality of a timing characteristic value as a function of the minimum access time.

28. A method according to claim 27, wherein said selecting of one of the plurality of timing characteristic values includes determining an access timing offset relative to the minimum access time and selecting one of the plurality of timing characteristic values as a function of the access time offset.

29. A method according to claim 27, wherein said determining of the set of timing values includes determining the set of timing values as a function of 1) a set of second differing frequencies of a third ring-oscillator path that includes the data input and excludes the data output and 2) the particular frequency of the second ring-oscillator path.

30. A method according to claim 23, wherein the as-manufactured digital storage element includes a data input and a data output, and said determining of the set of access time values includes determining the set of access time values as a function of 1) a set of first differing frequencies of a first ring-oscillator path that includes the data input and data output and 2) a particular frequency of a second ring-oscillator path that excludes the data input and the data output.

31. A method according to claim 30, further comprising creating the set of first differing frequencies by varying a delay in the first ring-oscillator path.

32. A method according to claim 31, wherein said varying of the delay in the first ring-oscillator path includes varying the delay over a range containing at least one delay value that causes the first ring-oscillator path to not oscillate.

* * * * *